United States Patent
Lee et al.

(10) Patent No.: US 10,996,885 B2
(45) Date of Patent: May 4, 2021

(54) HIGH BANDWIDTH MEMORY DEVICE AND SYSTEM DEVICE HAVING THE SAME

(71) Applicant: Samsung Electronics Co., Ltd., Suwon-si (KR)

(72) Inventors: Jun Gyu Lee, Hwaseong-si (KR); Reum Oh, Hwaseong-si (KR); Ki Heung Kim, Hwaseong-si (KR); Moon Hee Oh, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 129 days.

(21) Appl. No.: 16/208,989

(22) Filed: Dec. 4, 2018

(65) Prior Publication Data

US 2019/0278511 A1  Sep. 12, 2019

(30) Foreign Application Priority Data

Mar. 12, 2018 (KR) .................. 10-2018-0028456
Aug. 13, 2018 (KR) .................. 10-2018-0094449

(51) Int. Cl.
*G11C 5/02* (2006.01)
*G06F 3/06* (2006.01)
(Continued)

(52) U.S. Cl.
CPC .......... *G06F 3/0653* (2013.01); *G06F 3/0655* (2013.01); *G06F 12/0292* (2013.01);
(Continued)

(58) Field of Classification Search
CPC .. G11C 5/025; G11C 5/02; G11C 7/12; G11C 5/04; G11C 7/1006; G11C 7/22;
(Continued)

(56) References Cited

U.S. PATENT DOCUMENTS 7,428,603 B2  9/2008  Henson et al.
7,716,389 B1  5/2010  Bruce et al.
(Continued)

FOREIGN PATENT DOCUMENTS

TW  I533318 B  5/2016

OTHER PUBLICATIONS

Examination Report dated Jan. 27, 2021 from the Indian Patent Office for the corresponding Indian Patent Application No. 201924008450.

*Primary Examiner* — Hien N Nguyen
(74) *Attorney, Agent, or Firm* — Muir Patent Law, PLLC

(57) ABSTRACT

According to some embodiments, a high bandwidth memory device includes a base die and a plurality of memory dies stacked on the base die and electrically connected to the base die through a plurality of through substrate vias. The base die includes a plurality of first input buffers configured to receive channel clock signals, channel command/addresses, and channel data from a plurality of first bumps connected to the outside of the base die, a plurality of second input buffers configured to receive test clock signals, test command/addresses, and test data from a plurality of second bumps connected to the outside of the base die, a monitoring unit, a plurality of first output buffers connected to the monitoring unit and configured to output monitored data from the monitoring unit to the plurality of second bumps, and a plurality of paths from the plurality of first input buffers to the monitoring unit. The plurality of second bumps are connected to receive test clock signals, test command/addresses, and test data from the outside of the base die during a first operation mode, and to receive monitored data from the plurality of first output buffers during a second operation mode.

18 Claims, 18 Drawing Sheets

(51) Int. Cl.
  *G11C 7/10* (2006.01)
  *G06F 12/02* (2006.01)
  *G06F 13/16* (2006.01)
(52) U.S. Cl.
  CPC ........ *G06F 13/1694* (2013.01); *G11C 7/1057* (2013.01); *G11C 7/1084* (2013.01)
(58) Field of Classification Search
  CPC . G11C 7/222; G11C 29/1201; G11C 11/4093; G11C 11/4094; G11C 29/02; G11C 29/028; G11C 5/06; G11C 7/04; G11C 8/10; G11C 8/12; G11C 29/14; G11C 16/0483; G11C 16/08; G11C 16/10
  See application file for complete search history.

(56) References Cited

U.S. PATENT DOCUMENTS

| | | | |
|---|---|---|---|
| 7,889,864 B2 | 2/2011 | Nishikawa | |
| 2008/0100335 A1* | 5/2008 | Choi | G11C 29/02 326/30 |
| 2012/0117412 A1* | 5/2012 | Nakamura | G06F 9/3889 713/400 |
| 2012/0124251 A1 | 5/2012 | Hnatko et al. | |
| 2012/0272112 A1* | 10/2012 | Oh | G01R 31/318555 714/727 |
| 2013/0346706 A1 | 12/2013 | Lu et al. | |
| 2015/0293845 A1 | 10/2015 | Hsu et al. | |
| 2016/0147660 A1 | 5/2016 | Moyer | |
| 2017/0147519 A1 | 5/2017 | Kotta et al. | |

* cited by examiner

FIG. 7A

| COMMAND | CK | R0 | R1 | R2 | R3 | R4 | R5 |
|---|---|---|---|---|---|---|---|
| ACTIVATE | ↑ | L | H | | | | |
| | ↓ | | | | | | |
| | ↑ | | | | | | |
| | ↓ | | | | | | |
| | | | | | | | |

FIG. 7B

| COMMAND | CK | C0 | C1 | C2 | C3 | C4 | C5 | C6 | C7 |
|---|---|---|---|---|---|---|---|---|---|
| READ | ↑ | H | L | H | L | | | | |
| | ↓ | | | | | | | | |
| WRITE | ↑ | H | L | L | L | | | | |
| | ↓ | | | | | | | | |
| MODE REGISTER SET | ↑ | L | L | L | | | | | |
| | ↓ | | | | | | | | |
| | | | | | | | | | |

# HIGH BANDWIDTH MEMORY DEVICE AND SYSTEM DEVICE HAVING THE SAME

CROSS-REFERENCE TO RELATED APPLICATION

This U.S. non-provisional patent application claims priority under 35 U.S.C. § 119 to and the benefit of Korean Patent Application No. 10-2018-0028456, filed on Mar. 12, 2018 and Korean Patent Application No. 10-2018-0094449, filed on Aug. 13, 2018, in the Korean Intellectual Property Office (KIPO), the disclosure of which is incorporated herein by reference in its entirety.

BACKGROUND

1. Field of the Invention

The present inventive concept relates to a high bandwidth memory (HBM) device and a system device having the same.

2. Discussion of Related Art

A high bandwidth memory (HBM) device has a structure in which a plurality of memory dies and a base die (which may be described as a buffer die, or a logic die) are stacked. The plurality of memory dies are stacked above the base die, and the plurality of memory dies receive a command/address, for example including command and address bits and in some cases accompanied by data bits, from the base die using through substrate vias such as through silicon vias (TSV) passing through the plurality of memory dies, and input or output data from or to the base die.

A system device having an HBM device may include the HBM device and a controller (for example, a graphic processing unit (GPU) die, a central processing unit (CPU) die, or a system-on-chip (SoC), etc.). A base die of the HBM device receives a command/address transmitted from the controller, and inputs or outputs data from or to the controller. When a system device is manufactured in a 2.5 dimension (D) package, a base die and a controller of an HBM die are located above an interposer, and data and a command/address are transmitted through lines formed in the interposer. When a system device is manufactured in a 3D package, an HBM device is located above a controller, and the HBM device and the controller directly transmit data and a command/address.

However, the system device having the HBM device cannot monitor the data or the command/address transmitted from the controller to the base die of the HBM device.

SUMMARY OF THE INVENTION

The present disclosure is directed to providing a high bandwidth memory (HBM) device capable of monitoring data or a command/address transmitted from a controller to a base die of the HBM device, and a system device having the same.

The scope of the present inventive concept is not limited to the above-described objects, and other unmentioned objects may be clearly understood by those skilled in the art from the following descriptions.

According to some embodiments, a memory device includes a logic die and a plurality of memory dies stacked on the base die and electrically connected to the base die through a plurality of through substrate vias. The base die includes a plurality of first input buffers configured to receive channel clock signals, channel command/addresses, and channel data from a plurality of first bumps connected to the outside of the base die, a plurality of second input buffers configured to receive test clock signals, test command/addresses, and test data from a plurality of second bumps connected to the outside of the base die, a monitoring unit, a plurality of first output buffers connected to the monitoring unit and configured to output monitored data from the monitoring unit to the plurality of second bumps, and a plurality of paths from the plurality of first input buffers to the monitoring unit. The plurality of second bumps are connected to receive test clock signals, test command/addresses, and test data from the outside of the base die during a first operation mode, and to receive monitored data from the plurality of first output buffers during a second operation mode.

According to some embodiments, a high bandwidth memory device includes a base die and a stack of memory dies including a plurality of memory dies stacked on the base die, the base die including a plurality of first input/output (i/o) terminals that are command/address and data terminals and a plurality of second i/o terminals that are direct access terminals. A method for the high bandwidth memory device includes receiving at the plurality of first i/o terminals a command/address, a clock signal, and data; first transmitting the command/address, clock signal, and data received by the plurality of first i/o terminals from the base die to the stack of memory dies; and second transmitting at least part of one or more of the command/address, clock signal, and data received by a set of the plurality of first i/o terminals through a circuit of the base die to the plurality of second i/o terminals.

According to some embodiments, a memory system device includes a system device substrate, a memory device including a base die and a set of memory dies stacked on the system device substrate, the base die electrically connected to the set of memory dies by through substrate vias, a controller, and an interposer mounted on the system device substrate and on which the memory device and controller are mounted. The interposer electrically connects the memory device to the controller. The controller is configured to receive, as input to the memory system device, control signals and data signals, and based on the input, to output channel clock signals, channel command/addresses, and channel data to the memory device. The base die is configured to receive the channel clock signals, channel command/addresses, and channel data from the controller at a first set of input/output (i/o) terminals of the base die; transmit the channel clock signals, channel command/addresses, and channel data to the set of memory dies; and transmit at least a portion of one or more of the channel clock signals, channel command/addresses, and channel data through a monitoring unit to a second set of i/o terminals of the base die.

BRIEF DESCRIPTION OF THE DRAWINGS

FIGS. 7A and 7B are row and column command truth tables according to exemplary embodiments of the present disclosure.

DETAILED DESCRIPTION

Hereinafter, a high bandwidth memory (HBM) device and a system device having the same according to exemplary embodiments of the present inventive concept will be described with reference to the accompanying drawings.

Figure 1:
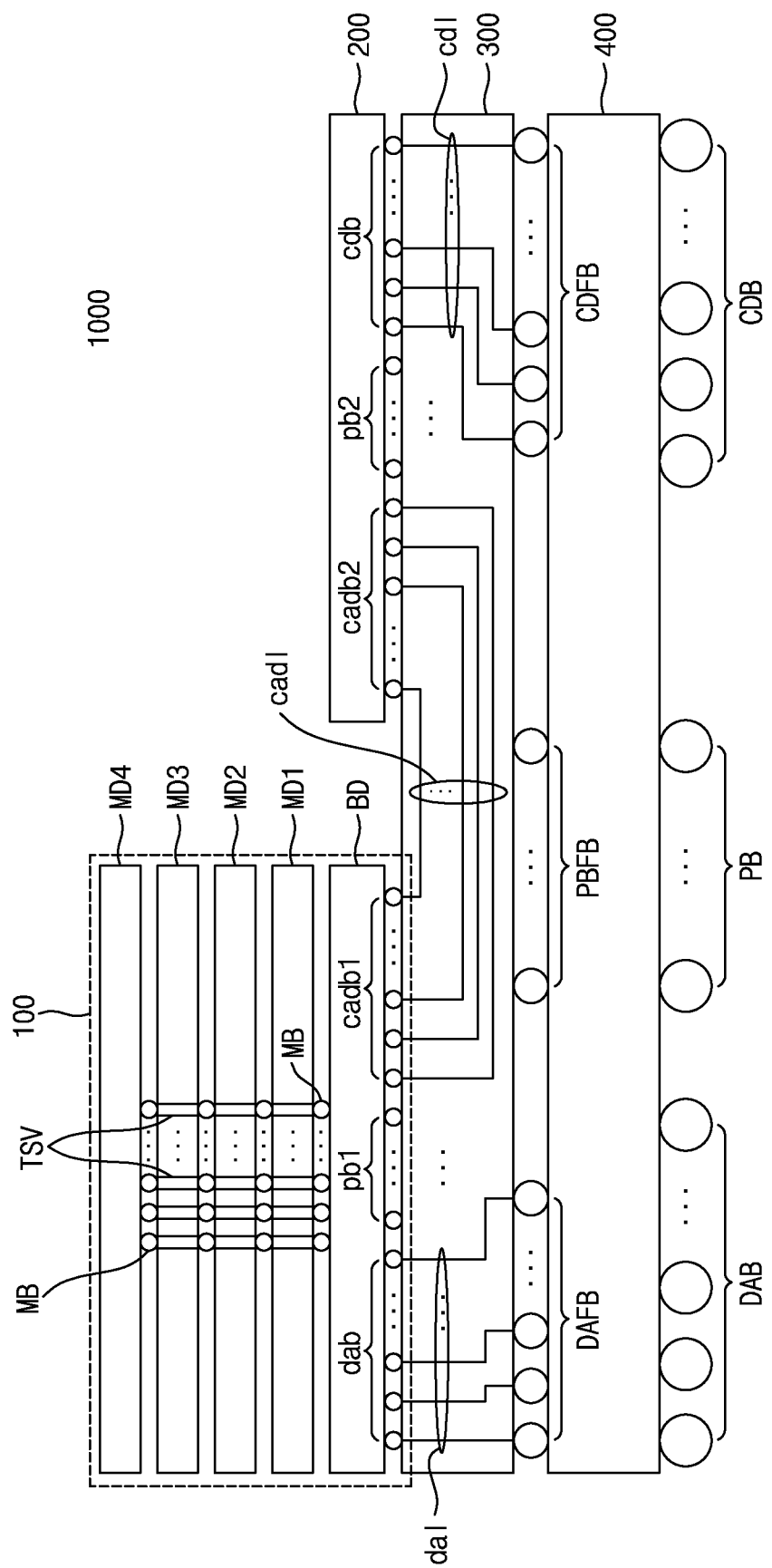
FIG. 1 is a diagram illustrating a structure of a system device having a 2.5 dimension (D) high bandwidth memory (HBM) device according to exemplary embodiments of the present disclosure.

FIG. 1 is a diagram illustrating a structure of a system device having a 2.5 dimension (D) HBM device according to exemplary embodiments of the present inventive concept, and illustrates a structure of a system device manufactured in a 2.5D package.

Referring to FIG. 1, a system device 1000 may include an HBM device 100, a controller 200, an interposer 300, and a printed circuit board (PCB) 400. For example the system device 1000 may be a semiconductor package including a plurality of semiconductor dies mounted on the printed circuit board (PCB) 400, which may be encapsulated by an encapsulant, and the printed circuit board (PCB) 400 may be a package substrate.

The HBM device 100 may include memory dies MD1 to MD4 and a base die BD (which may be described as and may be a buffer die, or a logic die). The memory dies MD1 to MD4 and the base die BD may be stacked in a vertical direction, and the stacked memory dies MD1 to MD4 are located above the base die BD. Each die, also described as a chip or semiconductor chip, may include an integrated circuit formed from a wafer. First bumps MB are formed between the stacked memory dies MD1 to MD4 and the base die BD, and through silicon vias (TSV) passing through the memory dies MD1 to MD4 may be formed between the first bumps MB. First direct access (DA) bumps dab, first power bumps pb1, and first command/address bumps and data bumps cadb1 may be arranged on a lower surface of the base die BD. The various bumps described herein may be referred to herein as interconnection terminals, or connection terminals, that transfer signals and/or voltage to, from, or between dies or substrates.

Second command/address bumps and data bumps cadb2, second power bumps pb2, and first control signal and data bumps cdb may be arranged on a lower surface of the controller 200. The controller 200 may be a graphic processing unit (GPU) die, a central processing unit (CPU) die, or a system-on-chip (SoC) die, etc.

The first bumps MB, the first DA bumps dab, the first and second power bumps pb1 and pb2, the first and second command/address bumps and data bumps cadb1 and cadb2, and the first control signal and data bumps cdb may be micro bumps.

Second DA bumps DAFB, third power bumps PBFB, and second control signal and data bumps CDFB may be arranged on a lower surface of the interposer 300. The interposer 300 may include DA lines dal connecting the first DA bumps dab and the second DA bumps DAFB, command/address lines and data lines cadl connecting the first command/address bumps and data bumps cadb1 and the second command/address bumps and data bumps cadb2, and control signal and data lines cdl connecting the first control signal and data bumps cdb and the second control signal and data bumps CDFB. Although not shown, power lines connecting the first power bumps pb1 and the third power bumps PBFB and connecting the second power bumps pb2 and the third power bumps PBFB may be further included in the interposer 300. The second DA bumps DAFB, the third power bumps PBFB, and the second control signal and data bumps CDFB may be flip die bumps.

DA balls DAB, power balls PB, and control signal and data balls CDB may be arranged on a lower surface of the PCB 400. The second DA bumps DAFB and the DA balls DAB may be connected, the third power bumps PBFB and the power balls PB may be connected, and the second control and data bumps CDFB and the control signal and data balls CDB may be connected, through the PCB 400. The various bumps or balls described herein connect to circuitry within one or more dies that the bumps are connected to. For example, power bumps or balls connect to circuit elements within a die that receive power signals (e.g., a constant voltage signal), and control signal and data bumps or balls connect to circuit elements within a die that receive control signals and/or data.

Figure 2:
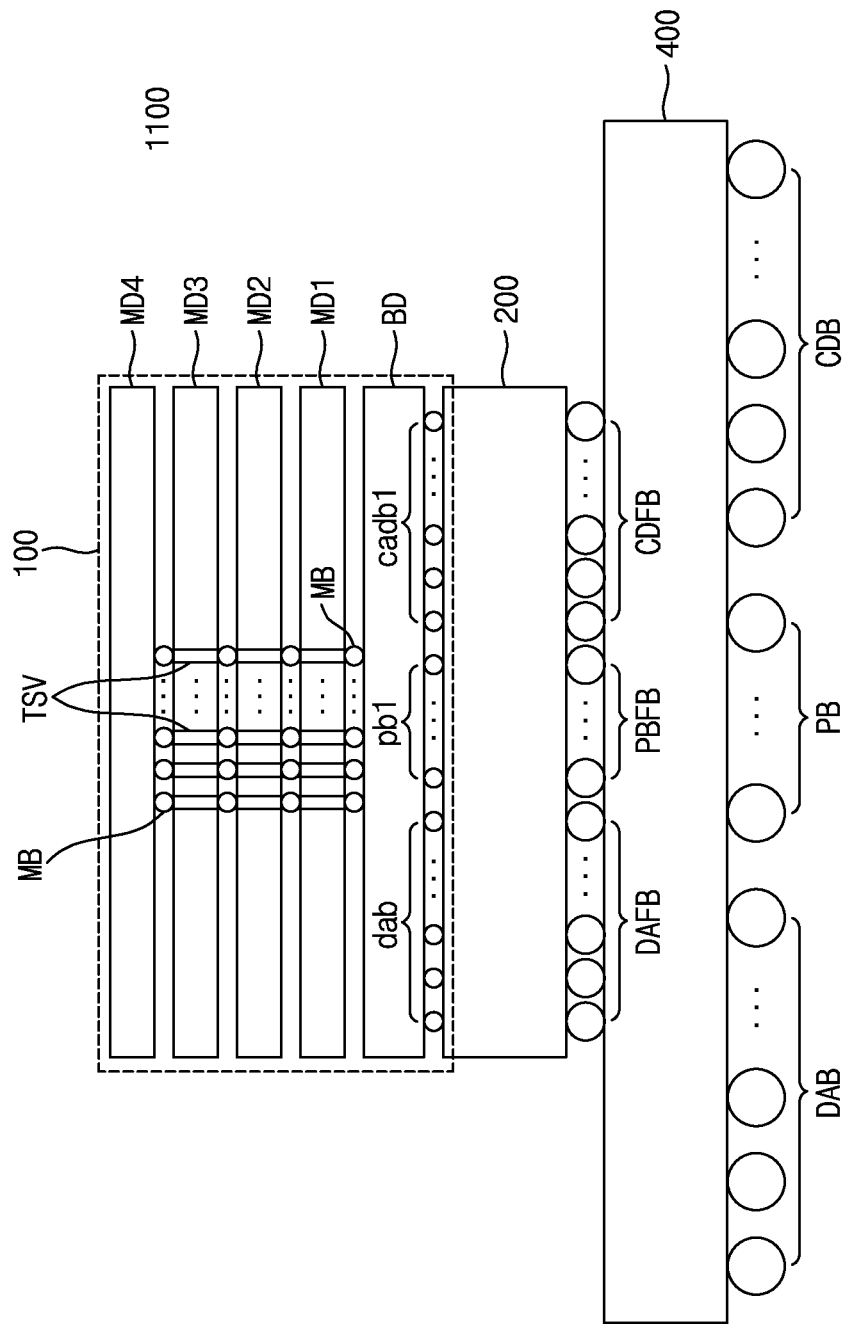
FIG. 2 is a diagram illustrating a structure of a system device having a 3D HBM device according to exemplary embodiments of the present disclosure.

FIG. 2 is a diagram illustrating a structure of a system device having a 3D HBM device according to exemplary embodiments of the present inventive concept, and illustrates a structure of a system device manufactured in a 3D package.

Referring to FIG. 2, unlike in FIG. 1, a system device 1100 may not include the interposer 300. Further, the base die BD of the HBM device 100 may be directly located on an upper surface of the controller 200. That is, the first DA bumps dab, the first power bumps pb1, and the first command/address bumps and data bumps cadb1 may be arranged on the upper surface of the controller 200.

The first DA bumps dab and the second DA bumps DAFB may be connected in the controller 200. The first power bumps pb1 and the third power bumps PBFB may be connected in the controller 200.

The controller 200 may receive a control signal and data applied through the second control signal and data bumps CDFB, and transmit channel command/addresses and channel data to the first command/address bumps and data bumps cadb1.

The controller 200 shown in FIGS. 1 and 2 may process data in response to the control signal applied through the second control signal and data bumps CDFB, generate the processed data as the channel data, and transmit the channel data with the channel command/addresses to the base die BD through the first command/address bumps and data bumps cadb1. Therefore, channel data and channel command/addresses described herein refers to command/addresses and data output from a controller and transmitted to a stack of memory dies, for example, through a base die. In some cases, the channel signals described herein (e.g., channel command/addresses and channel data), may be data intended for reading or writing to the memory dies for normal usage, as opposed to test signals which may be transmitted from a controller to a base die for testing purposes.

The base die BD shown in FIGS. 1 and 2 may include various logic circuits for performing logic processing functions. The base die BD may receive a test command/address and test data applied through the first DA bumps dab in a DA test mode, and output the test command/address and the test data to the plurality of memory dies MD1 to MD4.

Further, the base die BD shown in FIGS. 1 and 2 may output a portion of the channel command/addresses and the channel data applied through the first command/address bumps and data bumps cadb1 through the first DA bumps dab, in a monitoring operation. The monitoring operation may be performed in a system level test mode or a normal mode. Moreover, the base die BD may output the channel command/addresses or the channel data applied through the first command/address bumps and data bumps cadb1 to the plurality of memory dies MD1 to MD4 in the system level test mode or the normal mode. Accordingly, at least one portion of the channel command/addresses or the channel data transmitted from the controller 200 to the HBM device 100 may be output through the first DA bumps dab in the system level test mode or the normal mode, and thus be monitored outside in real time.

Figure 3:
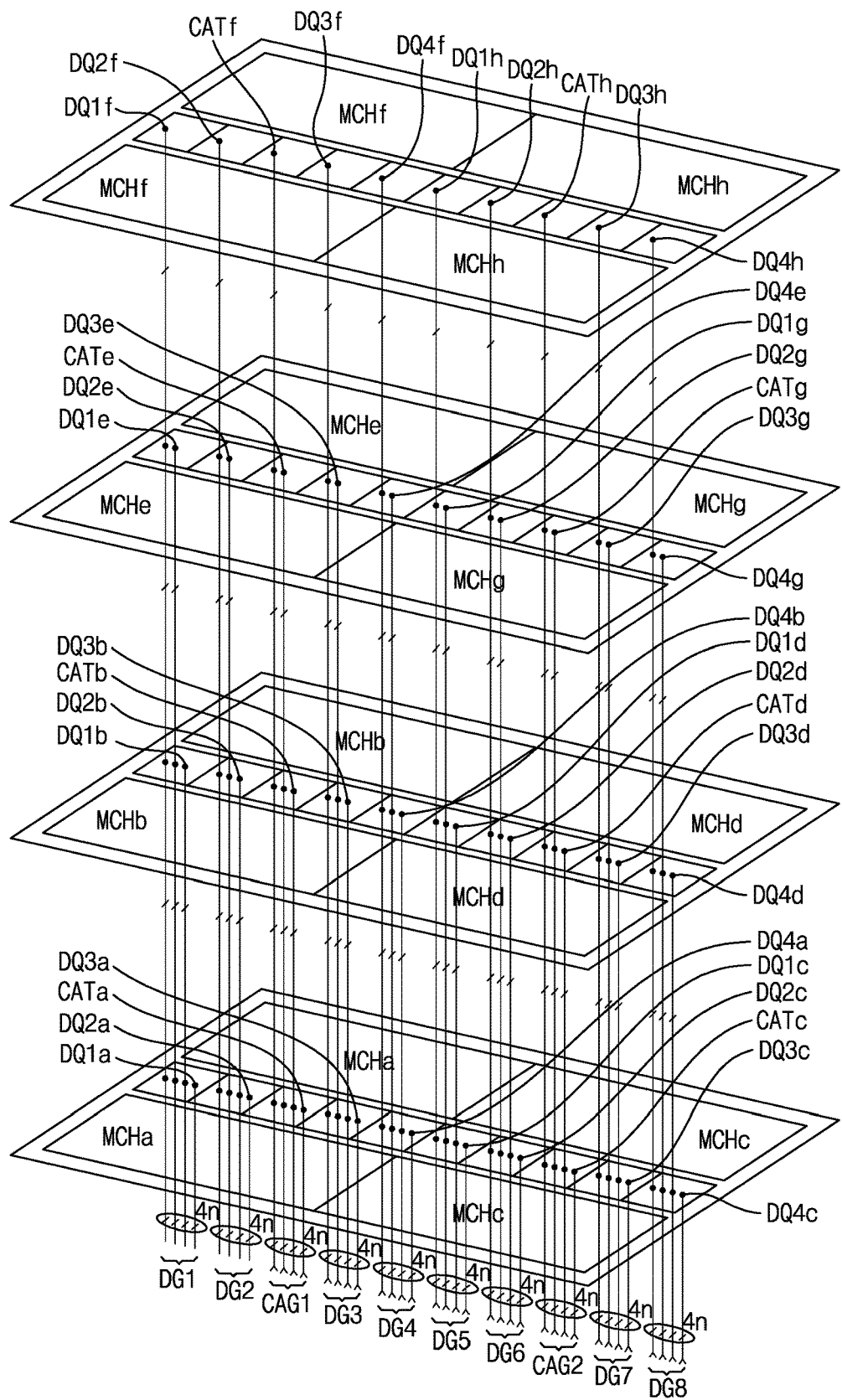
FIG. 3 is a diagram illustrating a configuration of a plurality of memory dies according to exemplary embodiments of the present disclosure.

FIG. 3 is a diagram illustrating a configuration of the plurality of memory dies according to exemplary embodiments of the present inventive concept. Each of the plurality of memory dies MD1 to MD4 may contain two memory channels MCHa and MCHc, MCHb and MCHd, MCHe and MCHg, MCHf and MCHh, and each of the memory channels MCHa to MCHh may include a predetermined number of memory banks (not shown). The memory channels MCHa, MCHb, MCHe, and MCHf may be arranged at each of left sides of the memory dies MD1 to MD4, and the memory channels MCHc, MCHd, MCHg, and MCHh may be arranged at each of right sides of the memory dies MD1 to MD4. Each of the memory channels MCHa to MCHh may be arranged to be vertically divided in a corresponding memory die MD1 to MD4. Corresponding data terminals DQ1$a$ to DQ4$a$, DQ1$b$ to DQ4$b$, DQ1$e$ to DQ4$e$, or DQ1$f$ to DQ4$f$, and corresponding command/address terminals CATa, CATb, CATe, or CATf may be included between corresponding memory channels MCHa, MCHb, MCHe, or MCHf which are arranged to be vertically divided, and corresponding data terminals DQ1$c$ to DQ4$c$, DQ1$d$ to DQ4$d$, DQ1$g$ to DQ4$g$, or DQ1$h$ to DQ4$h$, and corresponding command/address terminals CATc, CATd, CATg, or CATh may be included between corresponding memory channels MCHc, MCHd, MCHg, or MCHh which are arranged to be vertically divided. A first data group DG1 may be transmitted through the data terminals DQ1$a$, DQ1$b$, DQ1$e$, and DQ1$f$, and a second data group DG2 may be transmitted through the data terminals DQ2$a$, DQ2$b$, DQ2$e$, and DQ2$f$. Similarly, third to eighth data groups DG3 to DG8 may be transmitted through other data terminals DQ3$a$ to DQ4$h$. A first command/address group CAG1 may be transmitted through the command/address terminals CATa, CATb, CATe, and CATf, and a second command/address group CAG2 may be transmitted through the command/address terminals CATc, CATd, CATg, and CATh.

In FIG. 3, each of the data terminals and the command/address terminals may be the bumps MB shown in FIGS. 1 and 2. Further, lines vertically passing through the data terminals and the command/address terminals may be the TSVs.

Assuming that n-bit data is input and output through each of the data terminals DQ1$a$ to DQ4$a$, DQ1$h$ to DQ4$h$, a total of 32n-bit data may be input and output through all of the data terminals. Assuming that k-bit data is input and output through each of the command/address terminals CATa to CATh, a total of 8k-bit command/addresses may be input and output through all of the command/address terminals.

As illustrated in FIG. 3, lines corresponding to the second to eighth data groups DG2 to DG8 may be configured to be identical to the lines corresponding to the first data group DG1, and lines corresponding to the second command/address group CAG2 may be configured to be identical to the lines corresponding to the first command/address group CAG1.

Figure 4A:
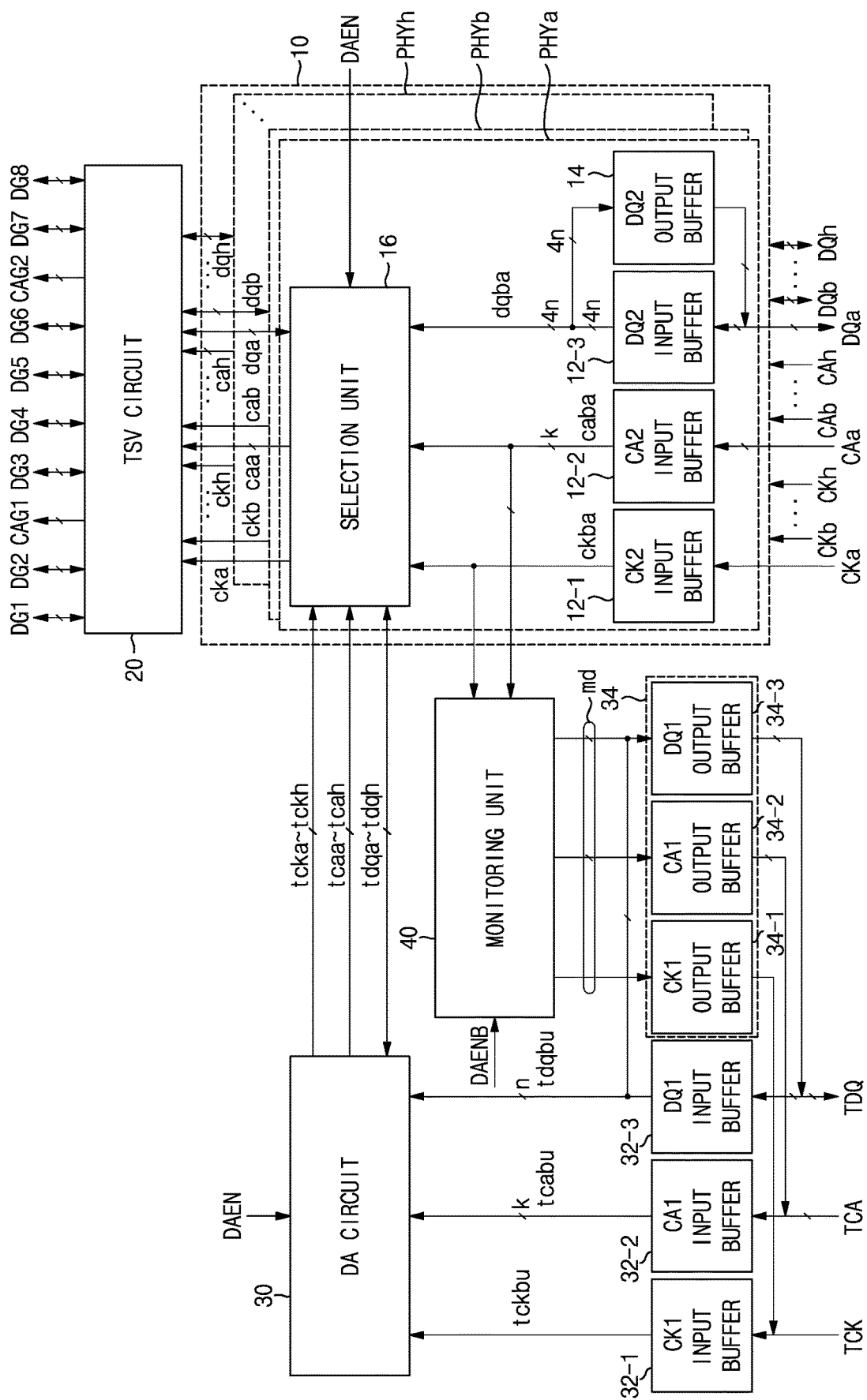
FIGS. 4A and 4B are diagrams illustrating a configuration of a base die according to exemplary embodiments of the present disclosure.

FIG. 4A is a diagram illustrating a configuration of a base die BD according to exemplary embodiments of the present inventive concept. The base die BD may include a physical (PHY) unit 10, a TSV circuit 20, a DA circuit 30, a monitoring unit 40, a clock signal (CK1) input buffer 32-1, a command/address (CA1) input buffer 32-2, a data (DQ1) input buffer 32-3, a clock signal (CK1) output buffer 34-1, a command/address (CA1) output buffer 34-2, and a data (DQ1) output buffer 34-3. The PHY unit 10 may include channel PHY units PHYa to PHYh configured to receive channel clock signals and channel command/addresses and input and output channel data for each of the memory channels MCHa to MCHh. Each of the channel PHY units PHYa to PHYh may include a clock signal (CK2) input buffer 12-1, a command/address (CA2) input buffer 12-2, a data (DQ2) input buffer 12-3, a data (DQ2) output buffer 14, and a selection unit 16. The clock signal (CK2) input buffer 12-1, command/address (CA2) input buffer 12-2, and data (DQ2) input buffer 12-3 may be described as a plurality of input buffers, such as a plurality of first input buffers, and may comprise a first set of input buffers. The clock signal (CK1) input buffer 32-1, command/address (CA1) input buffer 32-2, and data (DQ1) input buffer 32-3 may be described as a plurality of input buffers, such as a plurality of second input buffers, and may comprise a second set of input buffers. The clock signal (CK1) output buffer 34-1, the command/address (CA1) output buffer 34-2, and the data (DQ1) output buffer 34-3 may be described as a plurality of output buffers. In some embodiments, the first set of input buffers 12-1, 12-2, and 12-3 may be described generally as a first set of buffers and the plurality of output buffers 34-1, 34-2, and 34-3 combined with the second set of input buffers 32-1, 32-2, and 32-3 may be described generally as a second set of buffers. Note, however, that the terms "first," "second," etc., are used herein merely as a naming convention, unless the context indicates otherwise, and so these buffers and other items described using the names "first," or "second" may alternatively be named using "second," or "first," or "third," "fourth," etc., based on the context in which they are described.

Functions of the blocks shown in FIGS. 4A and 4B will be described below.

Referring to FIGS. 1 to 4A, when a DA enable signal DAEN is deactivated (an inverted DA enable signal DAENB is activated) in a system level test mode or a normal mode, each of the channel PHY units PHYa to PHYh may receive a corresponding channel clock signal CKa, CKb, . . . , or CKh, a corresponding channel command/address CAa, CAb, . . . , or CAh, and corresponding channel data DQa, DQb, . . . , or DQh applied from the controller 200 through the first command/address bumps and data bumps cadb1 and output a corresponding clock signal cka, ckb, . . . , or ckh, a corresponding command/address caa, cab, . . . , or cah, and corresponding data dqa, dqb, . . . , or dqh, or receive the corresponding data dqa, dqb, . . . , or dqh and output the corresponding channel data DQa, DQb, . . . , or DQh. Further, when the DA enable signal DAEN is activated in a DA test mode, each of the channel PHY units PHYa to PHYh may receive a corresponding channel test clock signal tcka, tckb, . . . , or tckh, a corresponding channel test command/address tcaa, tcab, . . . , or tcah, and corresponding test data tdqa, tdqb, . . . , or tdqh, which are output from the DA circuit unit 20, and output the corresponding clock signal cka, ckb, . . . , or ckh, the corresponding command/address caa, cab, . . . , or cah, and the corresponding data dqa, dqb, . . . , or dqh, to the TSV circuit unit 20, or receive the corresponding data dqa, dqb, or dqh, which are output from the TSV circuit unit 20, and output the corresponding channel test data tdqa, tdqb, . . . , or tdqh, to the DA circuit unit 30.

The clock signal input buffer 12-1 for each of the channel PHY units PHYa to PHYh may buffer the corresponding channel clock signal CKa, CKb, . . . , or CKh, and generate a corresponding buffered channel clock signal ckba, ckbb, . . . , or ckbh. The command/address input buffer 12-2 may buffer the corresponding channel command/address CAa, CAb, . . . , or CAh, and generate a corresponding buffered channel command/address caba, cabb, . . . , or cabh. The data input buffer 12-3 may buffer the corresponding channel data DQa, DQb, . . . , or DQh, and generate corresponding buffered channel data dqba, dqbb, . . . , or dqbh. The data output buffer 14 may receive the corresponding buffered channel data dqba, dqbb, . . . , or dqbh output from the selection unit 16, and generate the corresponding channel data DQa, DQb, . . . , or DQh. Note that in the case of the base die BD, the term "buffered channel data" is used herein as a naming convention to refer to data on an internal side of the output buffers described herein, with respect to the base die BD, as opposed to channel data on an external side of the output buffers (e.g., transmitted through bumps of the base die BD), which is not described as "buffered channel data."

When the DA enable signal DAEN is deactivated, the selection unit 16 for each of the channel PHY units PHYa to PHYh may select and transmit the corresponding buffered channel clock signal ckba, ckbb, . . . , or ckbh, the corresponding buffered channel command/address caba, cabb, . . . , or cabh, and the corresponding buffered channel data dqba, dqbb, . . . , or dqbh to generate the corresponding clock signal cka, ckb, . . . , or ckh, the corresponding command/address caa, cab, . . . , or cah, and the corresponding data dqa, dqb, . . . , or dqh. When the DA enable signal DAEN is activated, the selection unit 16 for each of the channel PHY units (PHYa to PHYh) may select and transmit the corresponding channel test clock signal tcka, tckb, . . . , or tckh, the corresponding channel test command/address tcaa, tcab, . . . , or tcah, and the corresponding channel test data tdqa, tdqb, . . . , or tdqh to generate the corresponding clock signal cka, ckb, . . . , or ckh, the corresponding channel command/address caa, cab, . . . , or cah, and the corresponding data dqa, dqb, . . . , or dqh. Further, when the DA enable signal DAEN is deactivated, the selection unit 16 for each of the channel PHY units PHYa to PHYh may select and transmit the corresponding data dqa, dqb, . . . , or dqh to generate the corresponding buffered channel data dqba, dqbb, . . . , or dqbh, and when the DA enable signal DAEN is activated, the selection unit 16 for each of the channel PHY units PHYa to PHYh may select and transmit the corresponding data dqa, dqb, . . . , or dqh to generate the corresponding channel test data tdqa, tdqb, . . . , or tdqh. The selection unit 16 may be a circuit including, for example, a plurality of switching circuits for performing the above selections, which switching circuits may be controlled based on the DA enable signal DAEN signal (e.g., to connect the TSV circuit 20 to the DA circuit 30 and disconnect the TSV circuit 20 from the input and output buffers 12-1, 12-2, 12-3 and 14 and the monitoring unit 40 when the DA enable signal DAEN is enabled, and to disconnect the TSV circuit 20 from the DA circuit 30 and connect the TSV circuit 20 to the input and output buffers 12-1, 12-2, 12-3 and 14 and the monitoring unit 40 when the DA enable signal DAEN is disabled.

The TSV circuit 20 may align the clock signals cka to ckh, the command/addresses caa to cah, and the data dqa to dqh output from the PHY units PHYa to PHYh, and generate the first to eighth data groups DG1 to DG8, and the first and second command/address groups CAG1 and CAG2.

The clock signal input buffer 32-1 may buffer a test clock signal TCK, and generate a buffered test clock signal tckbu. The command/address input buffer 32-2 may buffer a test command/address TCA and generate a buffered command/address tcabu. The data input buffer 32-3 may buffer test data TDQ and generate a buffered test data tdqbu.

When the DA enable signal DAEN is activated, the DA circuit 30 may receive the buffered test clock signal tckbu, the buffered test command/address tcabu, and the buffered test data tdqbu and output the corresponding channel test clock signal tcka, tckb, . . . , or tckh, the corresponding channel test command/address tcaa, tcab, . . . , or tcah, and the corresponding channel test data tdqa, tdqb, . . . , or tdqh, to the selection unit 16 for each of the channel PHY units PHYa to PHYh, and receive the corresponding channel test data tdqa, tdqb, . . . , or tdqh and output the buffered test data tdqbu. When the buffered test clock signal tckbu, the buffered test command/address tcabu, and the buffered test data tdqbu is 1-bit, k-bit, and n-bit data, respectively, the DA circuit 30 may duplicate the 1-bit buffered test clock signal tckb, the k-bit buffered test command/address tcab, and the n-bit buffered test data tdqb, and generate eight 1-bit buffered test clock signals tcka to tckh, eight k-bit channel test command/addresses tcaa to tcah, and eight 32n-bit channel test data tdqa to tdqh. When the eight 32-bit test data tdqa to tdqh are input from the selection unit 16, the DA circuit 30 may compare the eight 32n-bit channel test data tdqa to tdqh and the previously received n-bit buffered test data tdqb by n-bit, and output a compared result as the buffered test data tdqbu.

The clock signal output buffer 34-1 and the command/address output buffer 34-2 may buffer and output a portion of monitoring data md. The clock signal output buffer 34-1 may be used for outputting the buffered test clock signal tckbu.

The data output buffer 34-3 may buffer and output the buffered test data tdqbu, or buffer and output another portion of the monitoring data md.

The clock signal output buffer 34-1, the command/address output buffer 34-2, and the data output buffer 34-3 may configure a monitoring data output unit 34 outputting the monitoring data md. The monitoring data output unit 34 may receive the monitoring data md through the first DA bumps dab in the DA test mode.

When the DA enable signal DAEN is deactivated (the inverted DA enable signal DAENB is activated), the monitoring unit 40 may receive the buffered channel clock signals ckba to ckbh and the buffered channel command/addresses caba to cabh, which are generated from the channel PHY units PHYa to PHYh, through a plurality of paths between the input buffers 12-1, and 12-2, and the monitoring unit 40, and generate the monitoring data md. The monitoring unit 40 may receive all or a portion of the buffered channel clock signal ckba, and the buffered channel command/address caba, which are applied for a specific channel, for example, the memory channel MCHa, and generate the monitoring data md.

When the DA enable signal DAEN is activated, the base die BD shown in FIG. 4A may receive the test clock signal TCK, the test channel command/address TCA, and the test channel data TDQ applied through the first DA bumps dab and generate the first to eighth data groups DG1 to DG8 and the first and second command/address groups CAG1 and CAG2, and receive the first to eighth data groups DG1 to DG8 and generate the test data TDQ. Further, when the DA enable signal DAEN is deactivated, the base die BD may receive the channel clock signal CKa to CKh, the channel command/addresses CAa to CAh, and the channel data DQa to DQh, which are applied through the first command/address bumps and data bumps cadb1, and generate the first to eighth data groups DG1 to DG8 and the first and second command/address groups CAG1 and CAG2 to output the plurality of memory dies MD1 to MD4, and receive at least a portion of the channel clock signals CKa to CKh and the channel command/addresses CAa to CAh and generate the monitoring data md to output through the first DA bumps dab. Although not shown, when the DA enable signal DAEN is deactivated, the base die BD may generate at least a portion of the channel data DQa to DQh applied through the first command/address bumps and data bumps cadb1 as the monitoring data md, and output the monitoring data md through the first DA bumps dab. Further, the base die BD may receive the first to eighth data groups DG1 to DG8 output from the plurality of memory dies MD1 to MD4, and generate the channel data DQa to DQh. FIG. 4B is a diagram illustrating a configuration of a base die BD according to exemplary embodiments of the present inventive concept, where the base die BD may include a monitoring unit 41 instead of the monitoring unit 40 of the base die BD shown in FIG. 4A.

A function of the monitoring unit 41 among the blocks shown in FIG. 4B will be described below.

When the DA enable signal DAEN is deactivated, the monitoring unit 41 may receive at least a portion of the buffered channel clock signals CKa to CKh, the buffered channel command/addresses CAa to CAh, or the buffered channel data dqba to dqbh, which are generated from the channel PHY units PHYa to PHYh, and generate the monitoring data md. The monitoring unit 41 may receive all or a portion of the buffered channel clock signal ckba, the buffered channel command/address caba, or the buffered channel data dqba, which are applied for a specific channel, for example, the memory channel MCHa, and generate the monitoring data md.

Figure 4B:
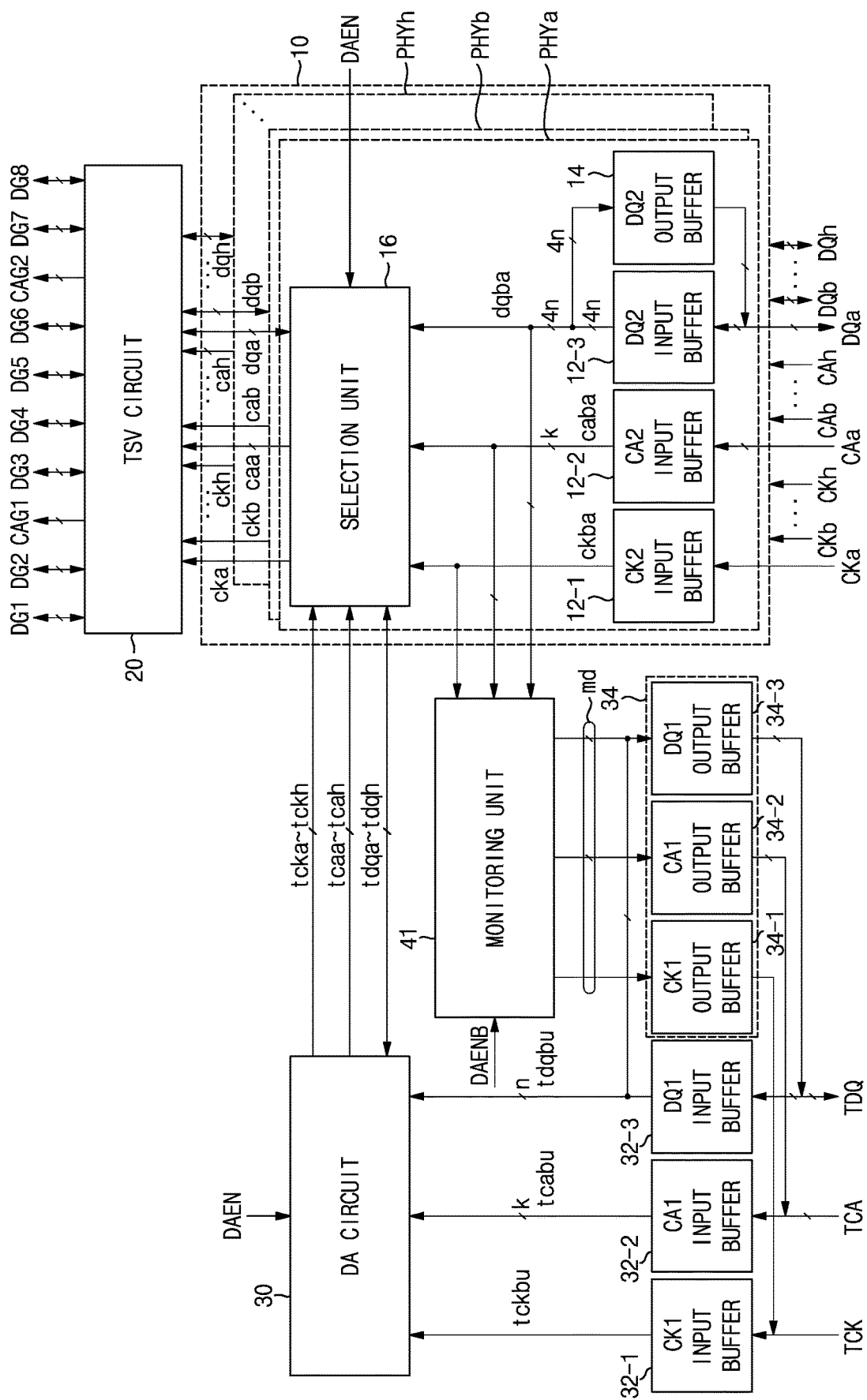

Further, the base die BD shown in FIG. 4A or 4B may receive the first to eighth data groups DG1 to DG8, and generate the monitoring data md through the first DA bumps dab. The monitoring unit 40 or 41 may receive all or a portion of the buffered channel data dqba to dqbh output from the selection unit 16, and generate the monitoring data and through the first DA bumps dab. Accordingly, the first to eighth data groups DG1 to DG8 output from the plurality of memory dies MD1 to MD4 may be monitored.

Therefore, as discussed above, the base die BD may include a first set of buffers (e.g., 12-1, 12-2, and 12-3) connected to a first set of i/o terminals and connected to receive the channel clock signals (e.g., CKa-CKh), channel command/addresses (e.g., CAa-CAh), and channel data (e.g., DQa-DQh) from the first set of i/o terminals, and a second set of buffers (e.g., 32-1, 32-3, 32-3, 34-1, 34-2, and 34-3) connected to the second set of i/o terminals and connected to transmit the at least a portion of one or more of the channel clock signals (CKa-CKh), channel command/addresses (e.g., CAa-CAh), and channel data (e.g., DQa-DQh) to the second set of i/o terminals. The second set of buffers (e.g., 32-1, 32-3, 32-3, 34-1, 34-2, and 34-3, specifically buffers 32-1, 32-2, and 32-3) may be further connected to receive a test clock signal (e.g., TCK), a test command/address (e.g., TCA), and test data (e.g., TDQ) from outside the base die BD. In addition, the base die BD may include circuitry and be configured such that the second set of buffers receives the test clock signal, a test command/address, and test data from outside the base die BD during a direct access test mode, and the second set of buffers receive at least a portion of one or more of the channel clock signals, channel command/addresses, and channel data (e.g., from the first set of buffers such as 12-1, 12-2, and 12-3) during a normal mode or system level test mode.

Figure 5:
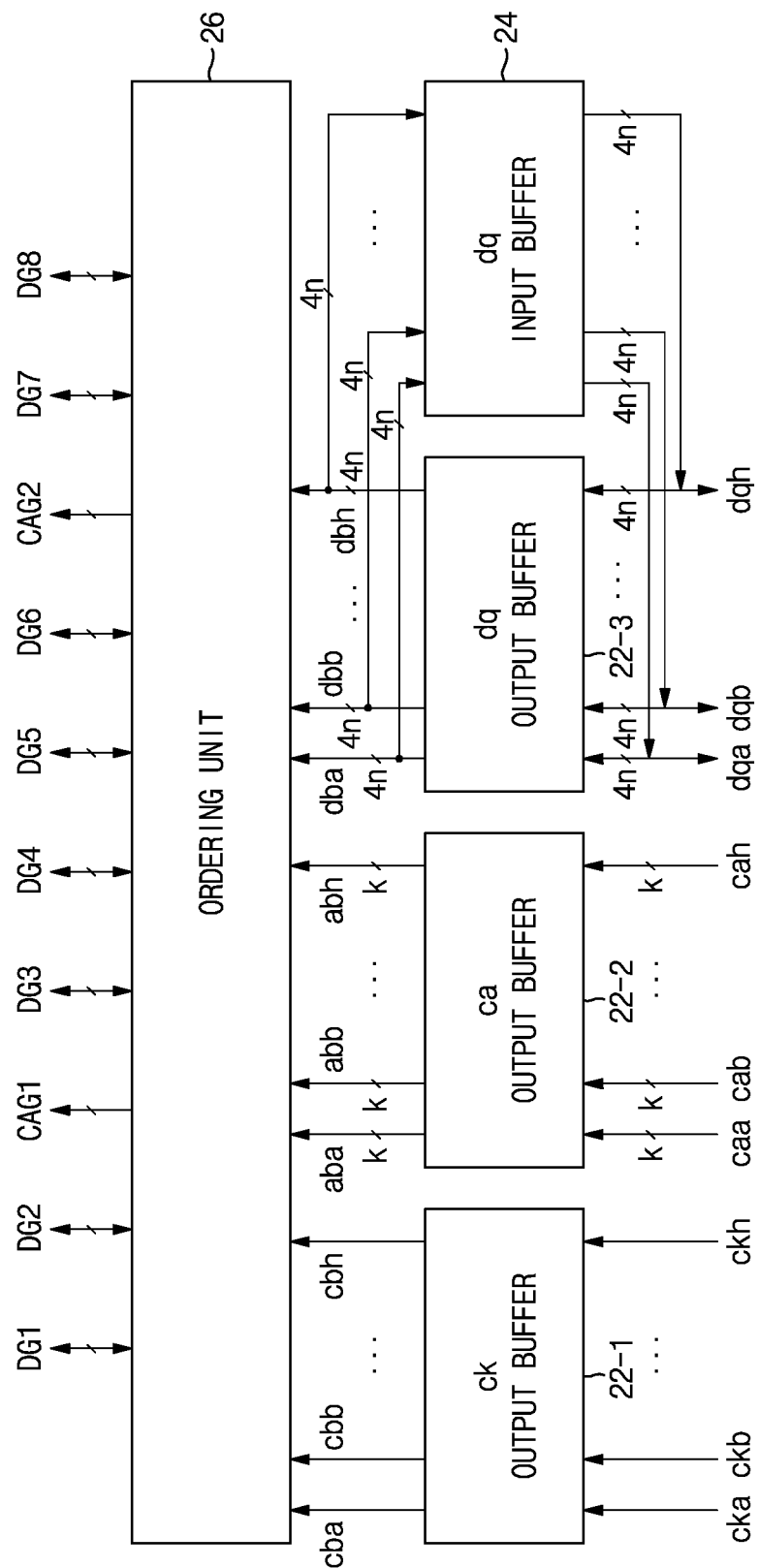
FIG. 5 is a block diagram illustrating a configuration of a through silicon via (TSV) circuit according to exemplary embodiments of the present disclosure.

FIG. 5 is a block diagram illustrating a configuration of a TSV circuit according to exemplary embodiments of the present inventive concept. A TSV circuit 20 may include a clock signal (ck) output buffer 22-1, a command/address (ca) output buffer 22-2, a data (dq) output buffer 22-3, a data (dq) input buffer 24, and an ordering unit 26.

Functions of the blocks shown in FIG. 5 will be described below.

The clock signal output buffer 22-1 may buffer the clock signals cka to ckh and output the buffered clock signals cba to cbh. The command/address output buffer 22-2 may receive the command/addresses caa to cah and output the buffered command/addresses aba to abh. The data output buffer 22-3 may receive the data dqa to dqh and output the buffered data dba to dbh. The data input buffer 24 may buffer the buffered data dba to dbh output from the ordering unit 26, and generate the data dqa to dqh. The ordering unit 26 may arrange the buffered clock signals cba to cbh and the buffered command/addresses aba to abh and generate the first command/address group CAG1 and the second command/address group CAG2, and arrange the buffered data dba to dbh and generate the first to eighth data groups DG1 to DG8. Further, the ordering unit 26 may arrange the first to eighth data groups DG1 to DG8 and generate the buffered data dba to dbh. That is, the ordering unit 26 may generate the buffered clock signals cba, cbb, cbe, and cbf, and the buffered command/addresses aba, abb, abe, and abf as the first command/address group CAG1, and generate the buffered clock signals cbc, cbd, cbg, and cbh and the buffered command/addresses abc, abd, abg, and abh as the second command/address group CAG2. Further, the ordering unit 26 may divide each of the buffered data dba, dbb, dbe, and dbf into four groups and generate first to fourth data groups DG1 to DG4, and divide each of the buffered data dbc, dbd, dbg, and dbh into four groups and generate fifth to eighth data groups DG5 to DG8.

Figure 6:
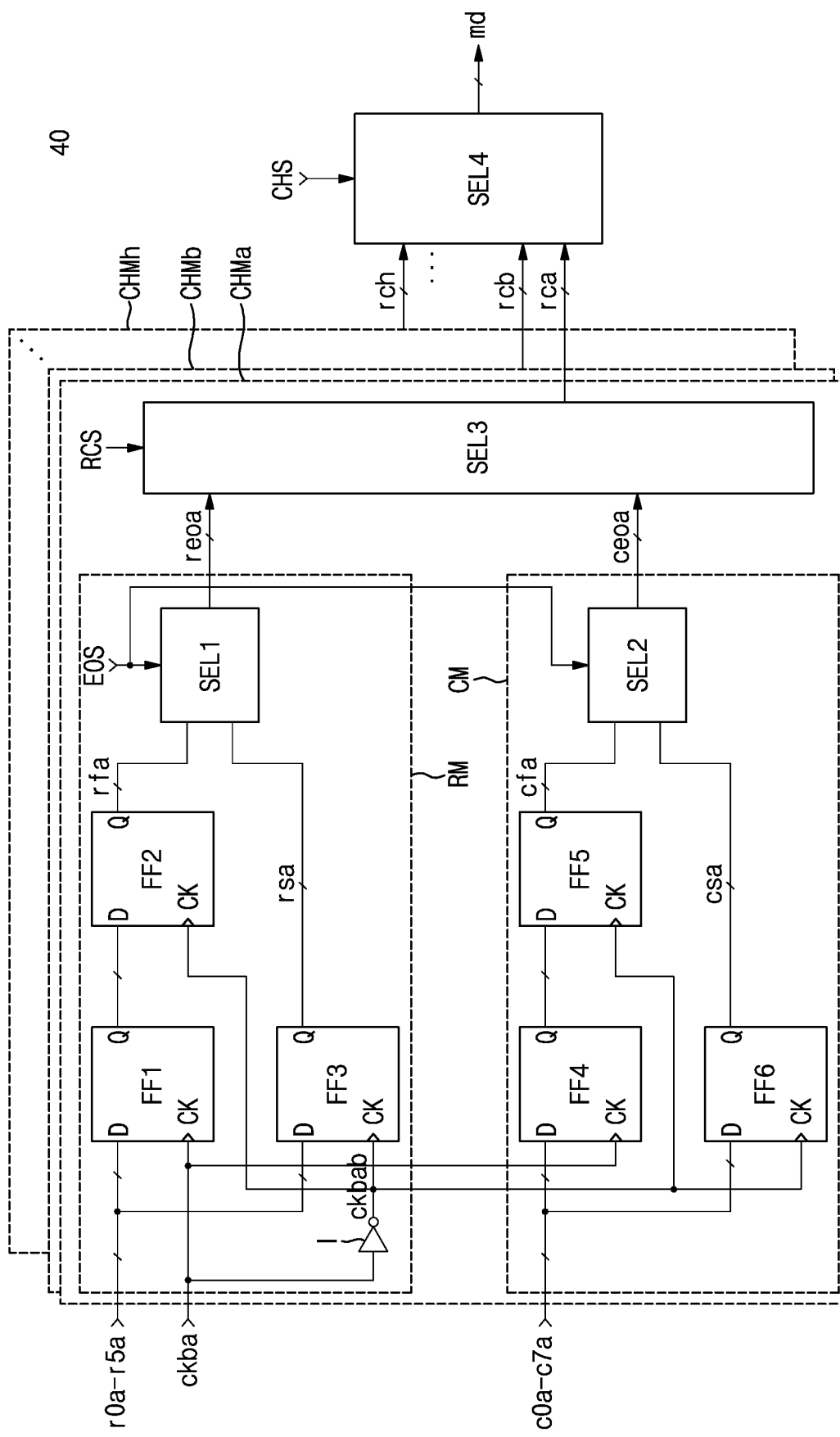
FIG. 6 is a diagram illustrating a configuration of a monitoring unit according to exemplary embodiments of the present disclosure.

FIG. 6 is a diagram illustrating a configuration of the monitoring unit according to exemplary embodiments of the present inventive concept. The monitoring unit 40 may be a monitoring relay circuit that relays data from input buffers 12-1, 12-2, and 12-3 to output buffers 34-1, 34-2, and 34-3 (see FIG. 4). The relayed data may be referred to as monitored data. The monitoring unit 40 may include channel monitoring units CHMa to CHMh, and a fourth selector SEL4. Each of the channel monitoring units CHMa to CHMh may be a channel monitoring relay circuit that may include a row monitoring unit RM, a column monitoring unit CM, and a third selector SEL3. The row monitoring unit RM may be a circuit, for example including an inverter I, first to third flip flops FF1 to FF3, and a first selector SEL1. The column monitoring unit CM may be a circuit, for example including fourth to sixth flip flops FF4 to FF6, and a second selector SEL2.

In FIG. 6, the buffered channel command/address caba applied to the channel monitoring unit CHMa may be configured to have 6-bit row command/addresses r0a to r5a and 8-bit column command/addresses c0a to c7a. The corresponding channel command/address cabb, cabc, . . . , or cabh which are applied to each of the channel monitoring units CHMb to CHMh may be configured to have a corresponding row command/address r0b to r5b, r0c to r5c, . . . , or r0h to r5h, and a corresponding column command/address c0b to c7b, c0c to c7c, . . . , or c0h to c7h.

The inverter I may invert the buffered channel clock signal ckba, and generate an inverted and buffered channel clock signal ckbab. The first flip flop FF1 may input and generate the row command/addresses r0a to r5a in response to a rising edge of the buffered channel clock signal ckba. The second flip flop FF2 may generate an output signal of the first flip flop FF1 as an odd row command/address rfa in response to a rising edge of the inverted and buffered channel clock signal ckbab. The third flip flop FF3 may generate the row command/address r0a to r5a as an even row command/address rsa in response to the rising edge of the inverted and buffered channel clock signal ckbab. The fourth flip flop FF4 may input and generate the column command/address c0a to c7a in response to a rising edge of the buffered channel clock signal ckba. The fifth flip flop FF5 may generate an output signal of the fourth flip flop FF4 as an odd column command/address cfa in response to the rising edge of the inverted and buffered channel clock signal ckbab. The sixth flip flop FF6 may generate the column command/address c0a to c7a as an even column command/address csa in response to the rising edge of the inverted and buffered channel clock signal ckbab. The first selector SEL1 may select the odd row command/address rfa or the even row command/address rsa in response to a first selection signal EOS, and generate a row output signal reoa. The second selector SEL2 may select the odd column command/address cfa or the even column command/address csa in response to the first selection signal EOS, and generate a column output signal ceoa. The third selector SEL3 may select the row output signal reoa or the column output signal ceoa in response to a second selection signal RCS, and generate a channel output signal rca. Each of the channel monitoring units CHMb to CHMh may perform the same operation as the channel monitoring unit CHMa, and generate a corresponding channel output signal rcb, rcc, . . . , or rch. The fourth selector SEL4 may select one among the channel output signals rca to rch in response to a third selection signal CHS, and generate the monitoring data md. The monitoring unit 40 may output the buffered channel clock signal ckba with the monitoring data md.

Therefore, in some embodiments, the monitoring unit 40 is connected between a first set of buffers (e.g., one or more of buffers 12-1, 12-2, and 12-3) and a second set of buffers (e.g., one or more of buffers 32-1, 32-2, 32-3, 34-1, 34-2, and 34-3), and is configured to transmit signals output from the first set of buffers to the second set of buffers during a first operation mode of the memory device (e.g., system level test mode or normal mode) and to prevent transmission of the signals output from the first set of buffers to the second set of buffers during a second operation mode of the memory device (e.g., direct access mode). For example, the direct access mode may be a mode in which test information including test clock signals, test command/addresses, and test data are input to and transmitted through a plurality of second bumps, which are direct access terminals (e.g., direct access bumps dab in FIG. 2), to the plurality of memory dies (e.g., MD1 through MD4 in FIG. 2) for testing of the plurality of memory dies. The system level test mode or normal mode may be a mode in which the channel clock signals, channel command/addresses, and channel data are input to and transmitted through a plurality of first bumps (e.g., channel command/address and data cadb1 bumps in FIG. 2) and a plurality of first input buffers (e.g., one or more of buffers 12-1, 12-2, and 12-3 in FIG. 4) to the plurality of memory dies for accessing the memory dies, while the channel clock signals, channel command/addresses, and channel data (e.g., monitored data) are also transmitted through the monitoring unit 40 in FIG. 4) and the plurality of first output buffers (e.g., output buffers 34-1, 34-2, and 34-3 in FIG. 4) to be output from the base die BD at the plurality of second bumps (e.g., to be received by the plurality of second bumps and transmitted from the base die BD). All of the plurality of second bumps may be used both for inputting the test information, and for outputting the monitored data.

FIG. 7A is a row command truth table according to exemplary embodiments of the present inventive concept. The row command/addresses R0 to R5 may be applied in response to a rising edge and a falling edge of the clock signal CK during two cycles. The row signals R2 to R5 may be applied with the row signals R0 and R1 having a "low" level and a "high" level indicating an activate command ACTIVATE at a first rising edge of the clock signal CK. Further, the row signals R0 to R5 may be applied at a first falling edge, a second rising edge, and a second falling edge of the clock signal CK. The row signals included in a hatched region I may include a row address and a bank address.

FIG. 7B is a column command truth table according to exemplary embodiments of the present inventive concept. The column command/address C0 to C7 may be applied in response to the rising edge and the falling edge of the clock signal CK during one cycle. The column signals C4 to C7 may be applied with the column signals C0 to C3 having a "high" level, a "low" level, a "high" level, and a "low" level indicating a read command READ at the first rising edge of the clock signal CK. The column signals C4 to C7 may be applied with the column signals C0 to C3 having a "high" level, a "low" level, a "low" level, and a "low" level indicating a write command WRITE at the first rising edge of the clock signal CK. Further, the column signals C0 to C7 may be applied at the first falling edge of the clock signal CK. The column signals included in a hatched region II may include the column address. The column signals C3 to C7 may be applied with the column signals C0 to C2 having "low" levels indicating a mode register set command MODE REGISTER SET at the first rising edge of the clock signal CK. Further, the column signals C0 to C7 may be applied at the first falling edge of the clock signal CK. The column signals included in a hatched region III may include a mode set code.

FIGS. 7A and 7B illustrate the row and column command truth tables of the HBM device standardized by Joint Electron Device Engineering Council (JEDEC). In FIGS. 7A and 7B, the clock signal CK may be the channel clock signal, and the row and column command/addresses R0 to R5 and C0 to C7 may be the channel command/address.

FIGS. 8A to 9B are timing diagrams for describing an operation of the monitoring unit 40 according to exemplary embodiments of the present inventive concept.

Referring to FIGS. 6, 7A, 7C, 8A to 9B, the activate command ACTIVATE and the row address may be applied according to the row command truth table, and the read command READ (or the write command WRITE) and the column address may be applied according to the column command truth table. A first odd row command/address RF1 and a first even row command/address RS2 may be sequentially applied as the row command/address R0 to R5 in response to the rising edge and the falling edge of the corresponding channel clock signal CKa, CKb, . . . , or CKh during one clock cycle, and the odd column command/ address CF, and the even column command/address CS may be sequentially applied as the column command/address C0 to C7. A second odd command/address RF2, and a second even command/address RS2 may be sequentially applied as the row command/address R0 to R5 in response to the rising edge and the falling edge of the corresponding channel clock signal CKa, CKb, . . . , or CKh during a next one clock cycle. Each of the buffered channel clock signals ckba to ckbh may be generated by buffering a corresponding one of the channel clock signals CKa to CKh. Each of the buffered channel command/addresses caba to cabh may be generated by buffering a corresponding one of the channel command/ addresses CAa to CAh. FIGS. 8A to 9B illustrate by assuming that the same buffered row command/addresses r0 to r5 and the same buffered column command/addresses c0 to c7 are applied as the buffered channel command/addresses caba to cabh.

Figure 8A:
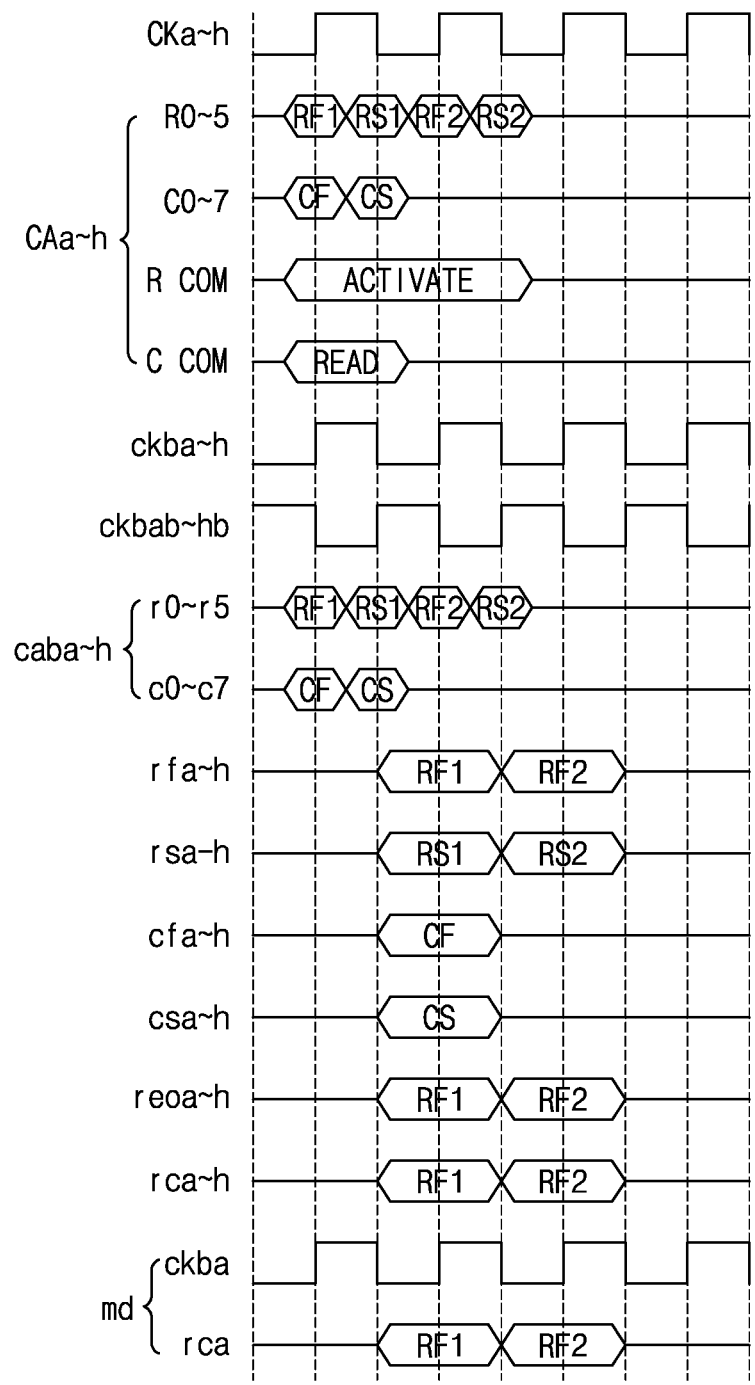
FIGS. 8A, 8B, 9A, and 9B are timing diagrams for describing an operation of a monitoring unit according to exemplary embodiments of the present disclosure.

FIG. 8A is a timing diagram for describing an operation of the monitoring unit 40 when the first selection signal EOS has a "high" level, the second selection signal RCS has a "high" level, and the third selection signal CHS has a "high" level, a "high" level, and a "high" level in order to select the channel monitoring unit CHMa among the eight channel monitoring units CHMa to CHMh.

Referring to FIGS. 6 and 8A, the row monitoring unit RM of the channel monitoring unit CHMa may sequentially generate the first odd row command/address RF1 and the second odd row command/address RF2 as the odd row command/address rfa and sequentially generate the first even row command/address RS1 and the second even row command/address RS2 as the even row command/address rsa, in response to the rising edge of the inverted and buffered channel clock signal ckbab. The column monitoring unit CM of the channel monitoring unit CHMa may generate the odd column command/address CF as the odd column command/address cfa and generate the even column command/address CS as the even column command/address csa, in response to the rising edge of the inverted and buffered channel clock signal ckbab. Each of the first and second selectors SEL1 and SEL2 for the channel monitoring unit CHMa may generate the first and second row command/ addresses RF1 and RF2 which are the odd row command/ address rfa as the row output signal reoa, and the odd column command/address CF which is the odd column command/ address cfa as the odd output signal ceoa, respectively, in response to the first selection signal EOS having the "high" level. The third selector SEL3 for the channel monitoring unit CHMa may generate the first and second odd row command/addresses RF1 and RF2 which are the row output signal reoa as the channel output signal rca in response to the second selection signal RCS having the "high" level. Each of the channel monitoring units CHMb to CHMh may generate a corresponding one of the channel output signals rcb to rch by performing the same operation as the channel monitoring unit CHMa.

The fourth selector SEL4 may generate the first and second odd row command/addresses RF1 and RF2 which are the channel output signal rca as the monitoring data and in response to the third selection signal CHS having the "high" level, the "high" level, and the "high" level. The monitoring unit 40 may generate the buffered channel clock signal ckba with the first and second row command/addresses RF1 and RF2 as the monitoring data md.

Figure 8B:
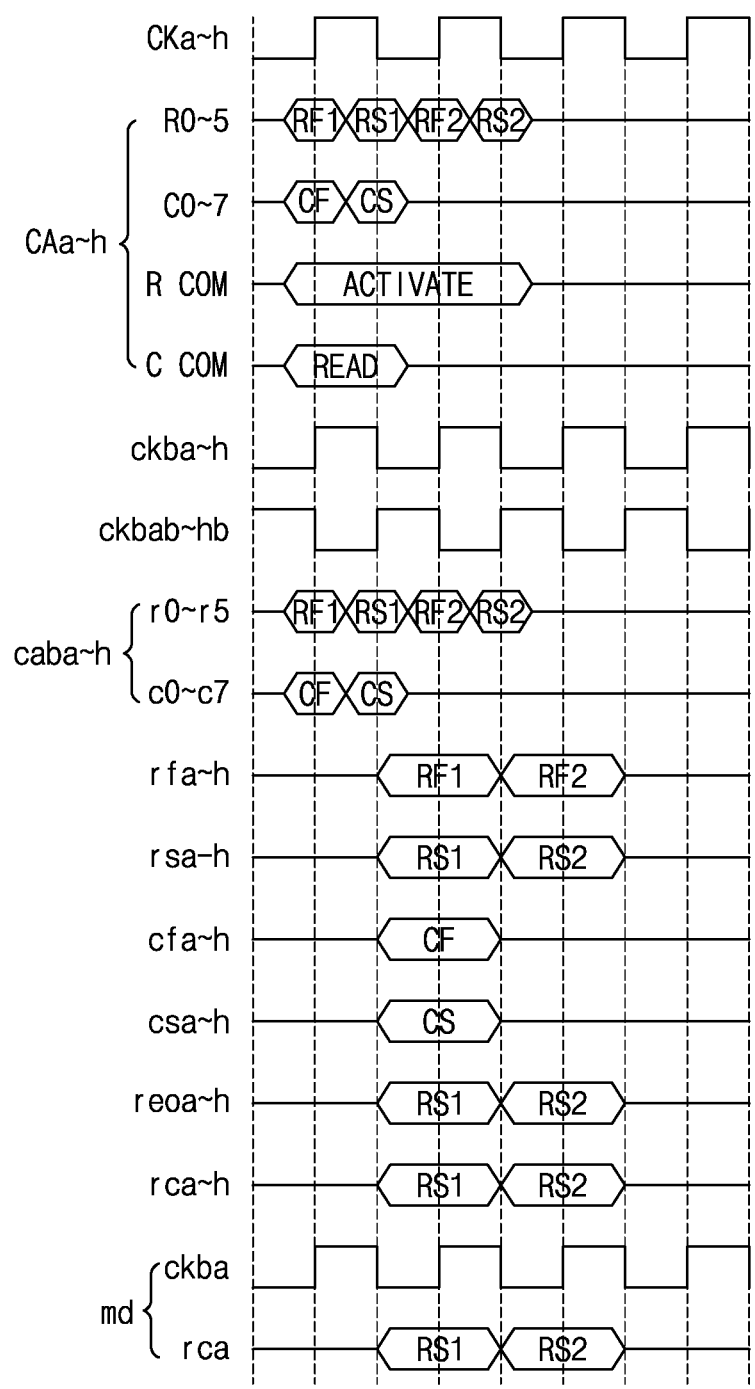

FIG. 8B is a timing diagram for describing the operation of the monitoring unit 40 when the first selection signal EOS has a "low" level, the second selection signal RCS has a "high" level, and the third selection signal CHS has a "high" level, a "high" level, and a "high" level.

Referring to FIGS. 6 and 8B, since the first selection signal EOS has the "low" level, the first and second selectors SEL1 and SEL2 may generate the first and second even row command/addresses RS1 and RS2 which are the even row command/address rsa as the row output signal reoa, and generate the even column command/address CS which is the even column command/address csa as the column output signal ceoa, respectively. The third selector SEL3 may generate the first and second even row column and addresses RS1 and RS2 which are the row output signal reoa as the channel output signal rca in response to the second selection signal RCS having the "high" level. The fourth selector SEL4 may generate the first and second even row command/ addresses RS1 and RS2 which are the channel output signal rca as the monitoring data md in response to the third selection signal CHS having the "high" level, the "high" level, and the "high" level. The monitoring unit 40 may generate the buffered channel clock signal ckba with the first and second even row command/addresses RS1 and RS2 as the monitoring data md.

Figure 9A:
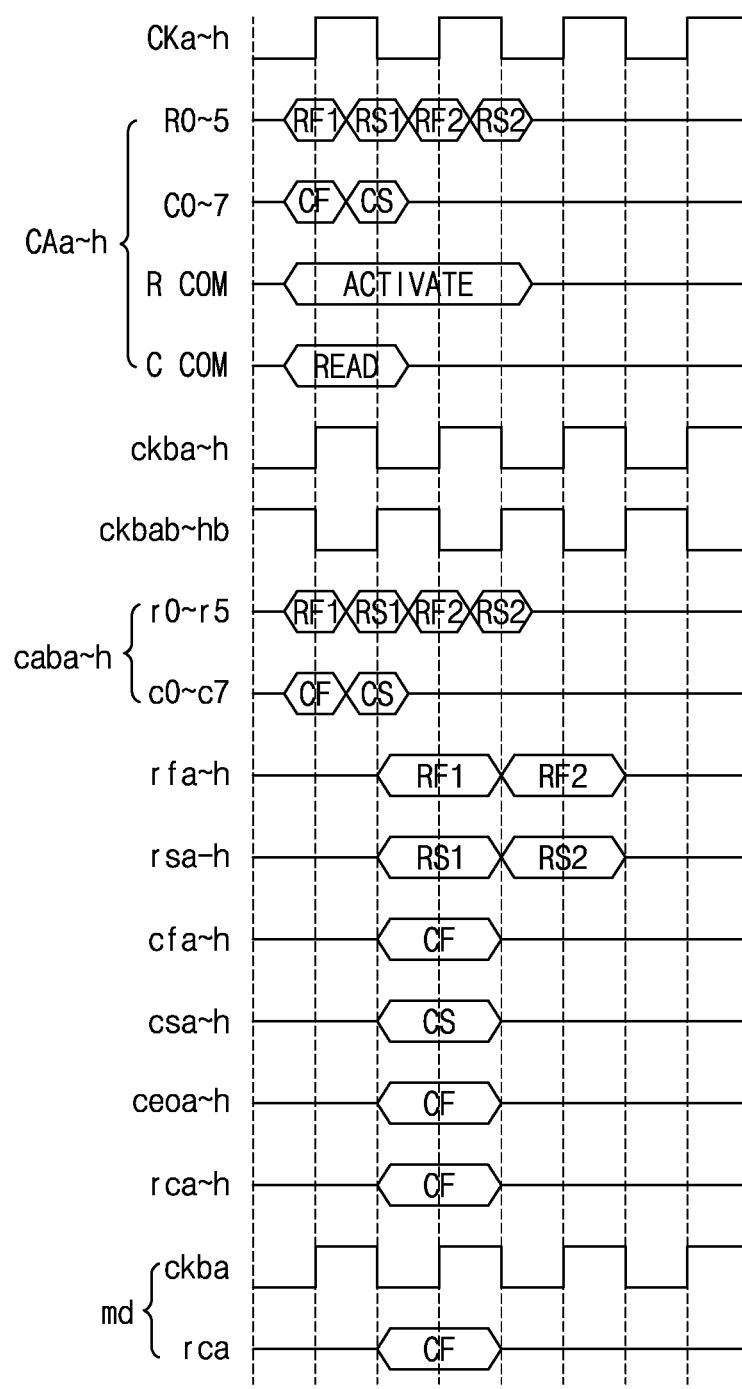

FIG. 9A is a timing diagram for describing the operation of the monitoring unit 40 when the first selection signal EOS has a "high" level, a second selection signal RCS has a "low" level, and the third selection signal CHS has a "high" level, a "high" level, and a "high" level.

Referring to FIGS. 6 and 9A, the operations of the first and second selectors SEL1 and SEL2 will be easily understood by referring to the operation of FIG. 8A described above. The third selector SEL3 may generate the odd column command/address CF which is the column output signal ceoa as the channel output signal rca in response to the second selection signal having the "low" level. The fourth selector SEL4 may generate the odd column command/address CF which is the channel output signal rca as the monitoring data md in response to the third selection signal CHS having the "high" level, the "high" level, and the "high" level. The monitoring unit 40 may generate the buffered channel output clock signal ckba with the odd column command/address CF as the monitoring data md.

Figure 9B:
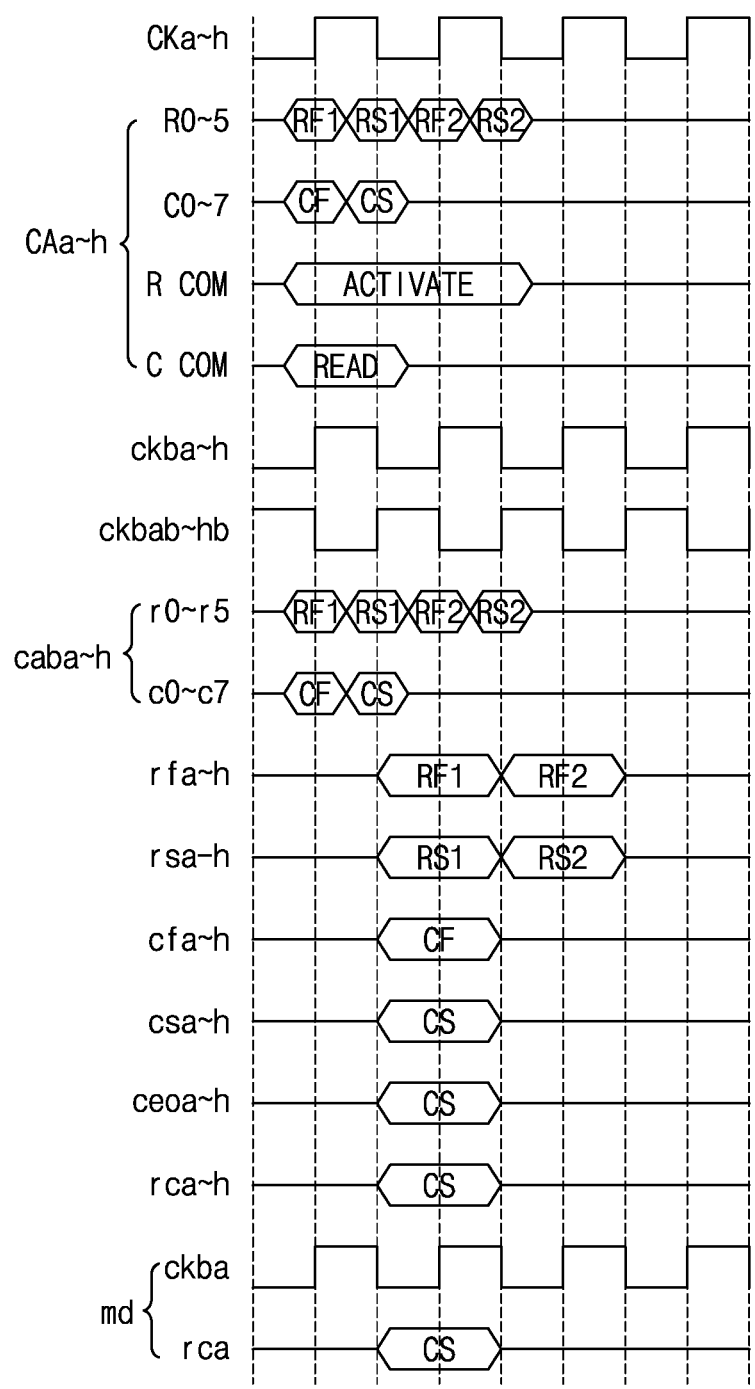

FIG. 9B is a timing diagram for describing the operation of the monitoring unit 40 when the first selection signal EOS has a "low" level, the second selection signal has a "low" level, and the third selection signal CHS has a "high" level, a "high" level, and a "high" level.

Referring to FIGS. 6 and 9B, the operations of the first and second selectors SEL1 and SEL2 will be easily understood by referring to the operation of FIG. 8B described above. The third selector SEL3 may generate the even column command/address CS which is the column output signal ceoa as the channel output signal rca in response to the second selection signal RCS having the "low" level. The fourth selector SEL4 may generate the even column command/address CS which is the channel output signal rca as the monitoring data md in response to the third selection signal CHS having the "high" level, the "high" level, and the "high" level. The monitoring unit 40 may generate the buffered channel clock signal ckba with the even column command/address CS as the monitoring data md.

As shown in FIGS. 8A to 9B, the monitoring unit 40 shown in FIG. 6 described above may receive the corresponding channel command/address CAa, CAb, . . . , or CAh (or the corresponding buffered channel command/address caba, cabb, . . . , or cabh) applied in a double data rate (DDR) to be arranged at a center of the corresponding channel clock signal CKa, CKb, . . . , or CKh (or the corresponding buffered channel clock signal ckba, ckbb, . . . , or ckhb), and output the monitoring data md generated in a single data rate (SDR) to be arranged at an edge of the corresponding channel clock signal CKa, CKb, . . . , or CKh (or the corresponding buffered channel clock signal ckba, ckbb, . . . , or ckbh).

The operation in which the channel clock signal CKa and the channel command/address CAa applied for the memory channel MCHa are output as the monitoring data md is described above with reference to FIGS. 8A to 9B, however, the corresponding channel clock signal CKb, CKc, . . . , or CKh and the corresponding channel command/address CAb, CAc, . . . , or CAh applied for the corresponding memory channel MCHb, MCHc, . . . , or MCHh may be output as the monitoring data md by differently setting the third selection signal CHS. Also, as described further below in connection with FIGS. 10-12, in some embodiments, the output of the monitoring data md may be generated in a double data rate (DDR).

Figure 10:
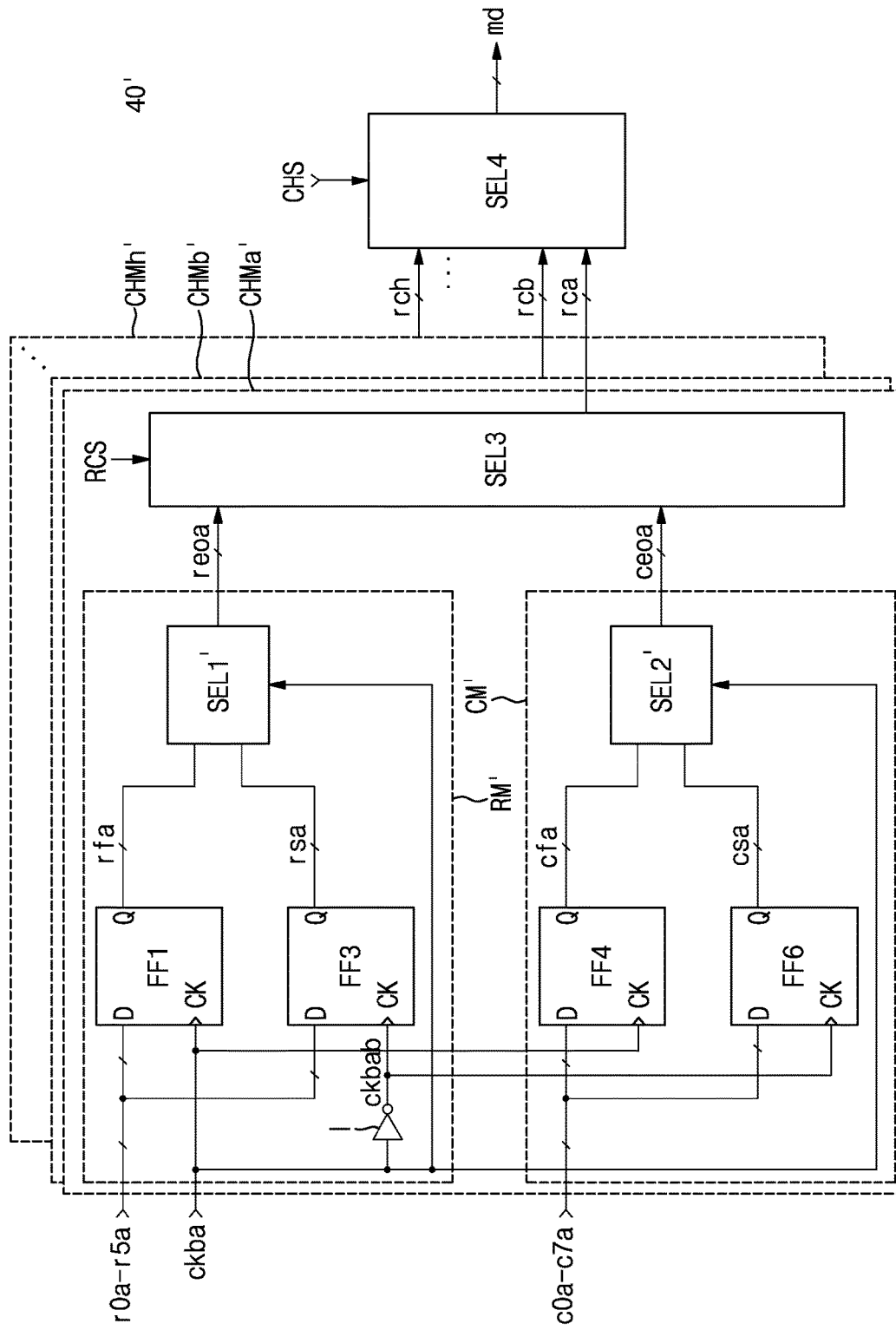
FIG. 10 is a diagram illustrating a configuration of a monitoring unit according to exemplary embodiments of the present disclosure.

FIG. 10 is a diagram illustrating a configuration of a monitoring unit according to exemplary embodiments of the present inventive concept. The monitoring unit 40' may include channel monitoring units CHMa' to CHMh', and a fourth selector SEL4. Each of the channel monitoring units CHMa' to CHMh' may include a row monitoring unit RM', a column monitoring unit CM', and a third selector SEL3. The row monitoring unit RM' may include an inverter I, first and third flip flops FF1 and FF3, and a first selector SEL1'. The column monitoring unit CM' may include fourth and sixth flip flops FF4 and FF6, and a second selector SEL2'.

Functions of blocks shown in FIG. 10 having the same reference numeral as the blocks shown in FIG. 6 will be easily understood with reference to the description of FIG. 6. Here, functions of the first selector SEL1' and the second selector SEL2' will be described.

The first selector SEL1' may select and output an odd row command/address rfa as a row output signal reoa in response to a rising edge of the buffered channel clock signal ckba, or select and output an even row command/address rsa as the row output signal reoa in response to a falling edge of the buffered channel clock signal ckba.

The second selector SEL2' may select and output an odd column command/address cfa as a column output signal ceoa in response to a rising edge of the buffered channel clock signal ckba, or select and output an even column command/address csa as the column output signal ceoa in response to a falling edge of the buffered channel clock signal ckba.

The channel monitoring unit CHMa' may generate the channel output signal rca, and each of the channel monitoring units CHMb' to CHMh' may perform the same operation as the channel monitoring unit CHMa', and generate the channel output signal rcb, rcc, . . . , or rch.

Figure 11:
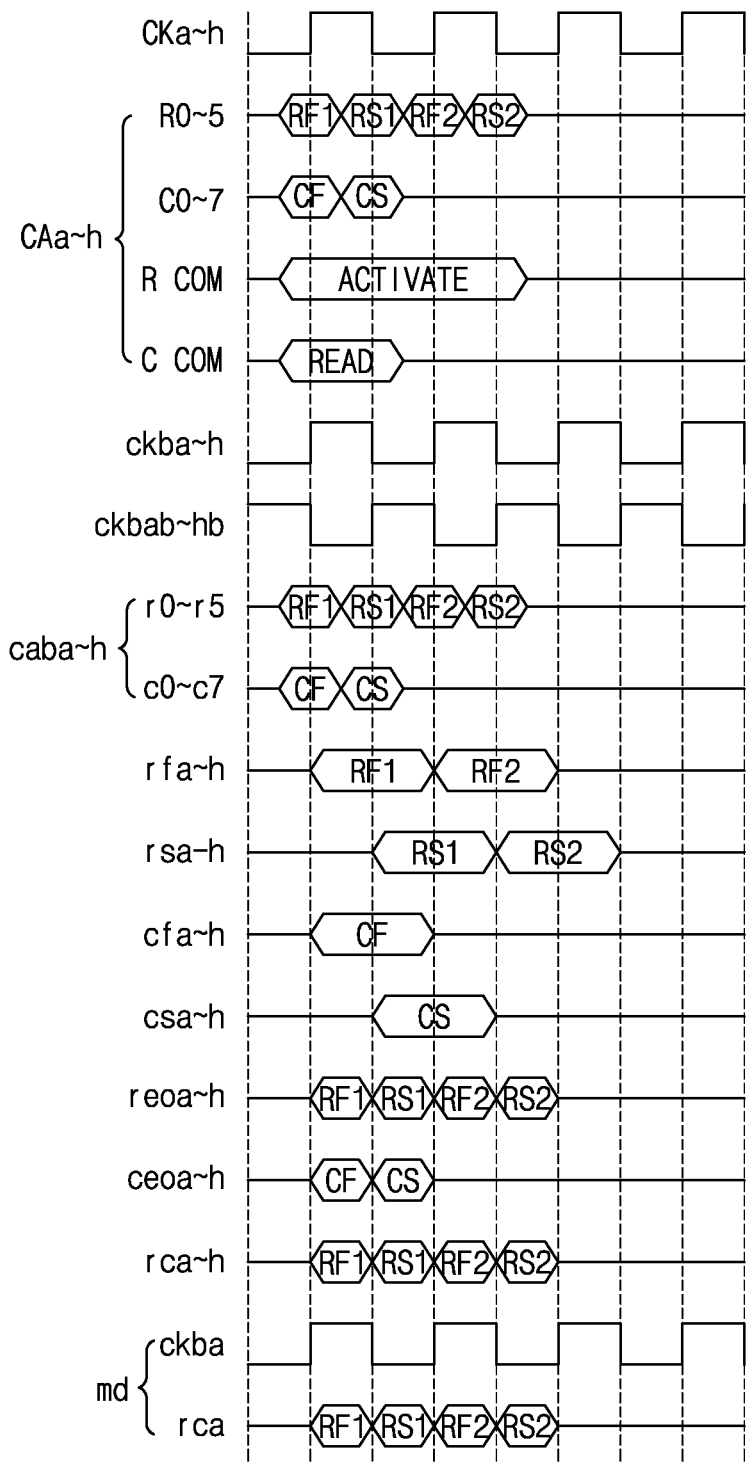
FIGS. 11 and 12 are timing diagrams for describing an operation of a monitoring unit according to exemplary embodiments of the present disclosure.
Figure 12:
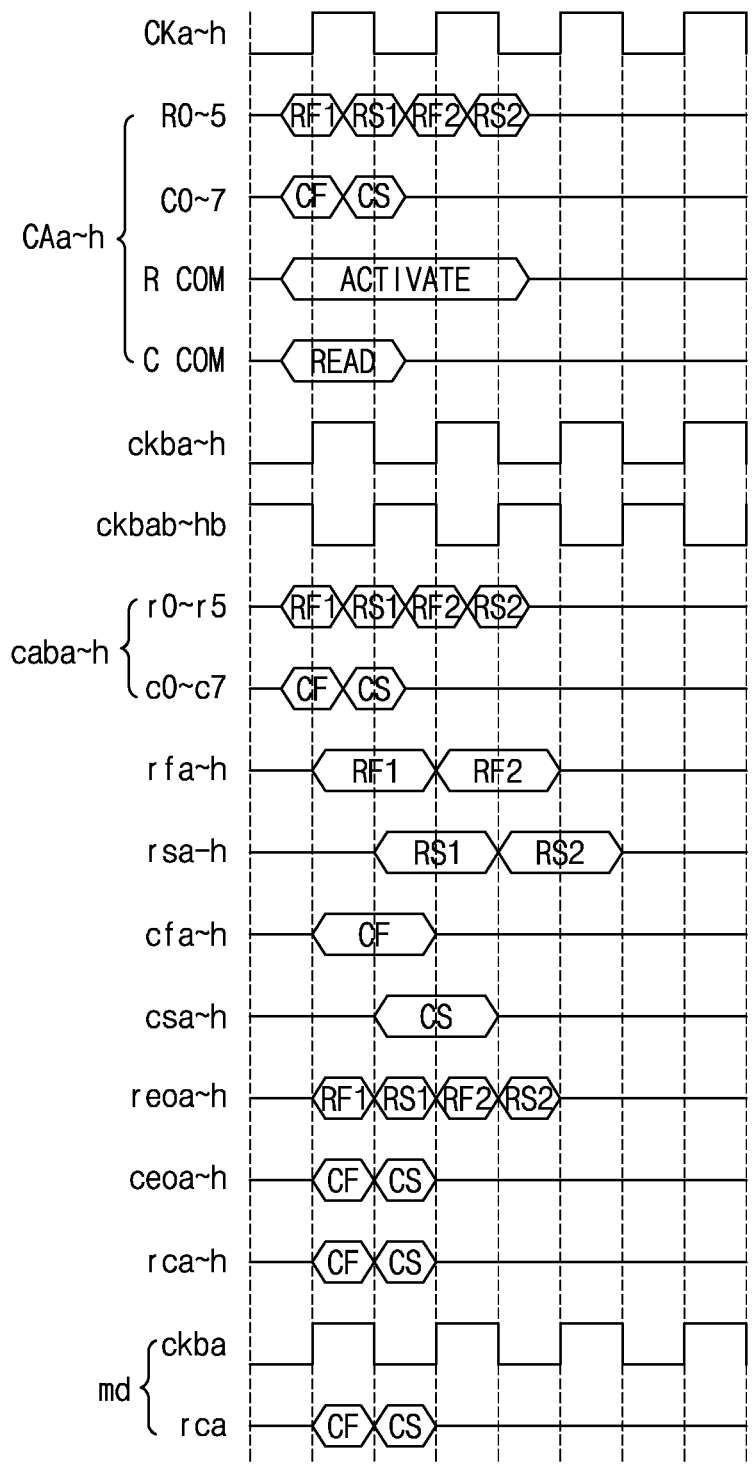

FIGS. 11 and 12 are operational timing diagrams for describing an operation of the monitoring unit 40' shown in FIG. 10 according to exemplary embodiments of the present inventive concept.

The assumption applied to the operational timing diagrams shown FIGS. 8A to 9B may be applied to those shown in FIGS. 11 and 12.

FIG. 11 is an operational timing diagram for describing an operation of the monitoring unit 40' when the second selection signal RCS is a "high" level and a third selection signal CHS is a "high" level, a "high" level, and a "high" level in order to select the channel monitoring unit CHMa' among eight channel monitoring units CHMa' to CHMh'.

Referring to FIGS. 10 and 11, unlike the description of FIG. 8A, the row monitoring unit RM' of the channel monitoring unit CHMa' may sequentially generate a first odd row command/address RF1 and a second odd row command/address RF2 as an odd row command/address rfa in response to a rising edge of the buffered channel clock signal ckba. Like the description of FIG. 8A, the row monitoring unit RM' of the channel monitoring unit CHMa' may sequentially generate a first even row command/address RS1 and a second even row command/address RS2 as an even row command/address rsa in response to a rising edge of the inverted and buffered channel clock signal ckbab. The first selector SEL1' of the row monitoring unit RM' of the channel monitoring unit CHMa' may select the odd row command/address rfa in response to the rising edge of the buffered channel clock signal ckba, select the even row command/address rsa in response to a falling edge of the buffered channel clock signal ckba, and sequentially generate the first odd row command/address RF1, the first even row command/address RS1, the second odd row command/address RF2, and the second even row command/address RS2, as the row output signal reoa.

Referring to FIGS. 10 and 11, unlike the description of FIG. 8A, the column monitoring unit CM' of the channel monitoring unit CHMa' may generate an odd column command/address CF as an odd column command/address cfa in response to a rising edge of the buffered channel clock signal ckba. Further, like the description of FIG. 8A, the column monitoring unit CM' of the channel monitoring unit CHMa' may generate an even column command/address CS as an even column command/address csa. The second selector SEL' of the column monitoring unit CM' of the channel monitoring unit CHMa' may select the odd column command/address cfa in response to the buffered channel clock signal ckba having a "high" level, select the even column command/address csa in response to the buffered channel clock signal ckba having a "low" level, and sequentially generate the odd column command/address cfa and the even column command/address csa as a column output signal ceoa.

Like the description of FIG. 8A, the third selector SEL3, and the fourth selector SEL4 of the channel monitoring unit CHMa' may generate the row output signal reoa as a channel output signal rca. The channel monitoring units CHMb' to CHMh' may generate channel output signals rcb to rch by performing the same operation as the channel monitoring unit CHMa'.

The fourth selector SEL4 may generate the first odd row command/address RF1, the first even row command/address RS1, the second odd row command/address RF2, and the second even row command/address RS2, which are the channel output signal rca, as the monitoring data md, in response to the third selection signal CHS having the "high" level, the "high" level, and the "high" level. The monitoring unit 40' may further generate the buffered channel clock signal ckba as the monitoring data md.

FIG. 12 is an operational timing diagram for describing an operation of the monitoring unit 40' when the second selection signal is a "low" level and the third selection signal CHS is a "high" level, a "high" level, and a "high" level.

Referring to FIGS. 10 and 12, operations of the first and second selectors SEL1' and SEL2' will be easily understood with reference to the description of FIG. 11. The third selector SEL3 may sequentially generate the odd column command/address CF and the even column command/address CS which are the column output signal ceoa as the channel output signal rca in response to the second selection signal RCS having the "low" level. The fourth selector SEL4 may generate the channel output signal rca as the monitoring data md in response to the third selection signal CHS having the "high" level, the "high" level, and the "high" level. The monitoring unit 40' may further generate the buffered channel clock signal ckba as the monitoring data md.

As shown in FIGS. 11 and 12, the monitoring unit 40' shown in FIG. 10 described above may receive the corresponding channel data DQa, DQb, . . . , or DQh (or the corresponding buffered channel data dqba, dqbb, . . . , or dqbh) applied in a DDR to be arranged at a center of the corresponding channel clock signal CKa, CKb, . . . , or CKh (or the corresponding buffered channel clock signal ckba, ckbb, . . . , or ckhb), and output the monitoring data md generated in the DDR to be arranged at an edge of the corresponding channel clock signal CKa, CKb, . . . , or CKh (or the corresponding buffered channel clock signal ckba, ckbb, . . . , or ckbh).

The operation in which the channel clock signal CKa and the channel command/address CAa applied to the memory channel MCHa are output as the monitoring data md is described above with reference to FIGS. 11 and 12, but the corresponding channel clock signals CKb to CKh and the corresponding channel command/address CAb to CAh applied to the corresponding memory channel MCHb to MCHh may be output as the monitoring data md by differently setting the third selection signal CHS.

The monitoring unit 40 or 40' shown in FIG. 6 or 10 described above may not include the first and second selectors SEL1 and SEL2 or SEL1' and SEL2', and/or the third selector SEL3. When the monitoring unit 40 or 40' does not include the first and second selectors SEL1 and SEL2 or SEL1' and SEL2', the odd and even row command/addresses rfa and rsa may be generated as the channel output signal rca, or the odd and even column command/addresses cfa and csa may be generated as the channel output signal rca. When the monitoring unit 40 does not include the first to third selectors SEL1, SEL2, and SEL3, the odd and even row and column command/addresses rfa, rsa, cfa, and csa may be generated as the channel output signal rca.

Further, the monitoring unit 40 or 40' shown in FIG. 6 or 10 described above may not include the first to sixth flip flops FF1 to FF6, or the first, the third, the fourth, and the sixth flip flops FF1, FF3, FF4, and FF6. When the monitoring unit 40 or 40' does not include the first to sixth flip flops FF1 to FF6, or the first, the third, the fourth, and the sixth flip flops FF1, FF3, FF4, and FF6, the monitoring unit 40 or 40' may generate the corresponding row command/addresses r0a to r5a, . . . , r0h to r5h and the corresponding column command/addresses (c0a to c7a), . . . , (c0h to c7h)) shown in FIGS. 8A to 9B, or FIGS. 11 and 12 as the monitoring data md through the first and fourth selectors (SEL1 to SEL4, or SEL1', SEL2', SEL3, and SEL4). That is, the monitoring unit 40 or 40' may receive the corresponding channel command/address CAa, CAb, . . . , or CAh (or the corresponding buffered channel command/address caba, cabb, . . . , or cabh) applied to be arranged at a center of the corresponding channel clock signal CKa, CKb, . . . , or CKh (or the corresponding buffered channel clock signal ckba, ckbb, . . . , or ckbh), and generate the monitoring data md output in a SDR or a DDR.

Figure 13:
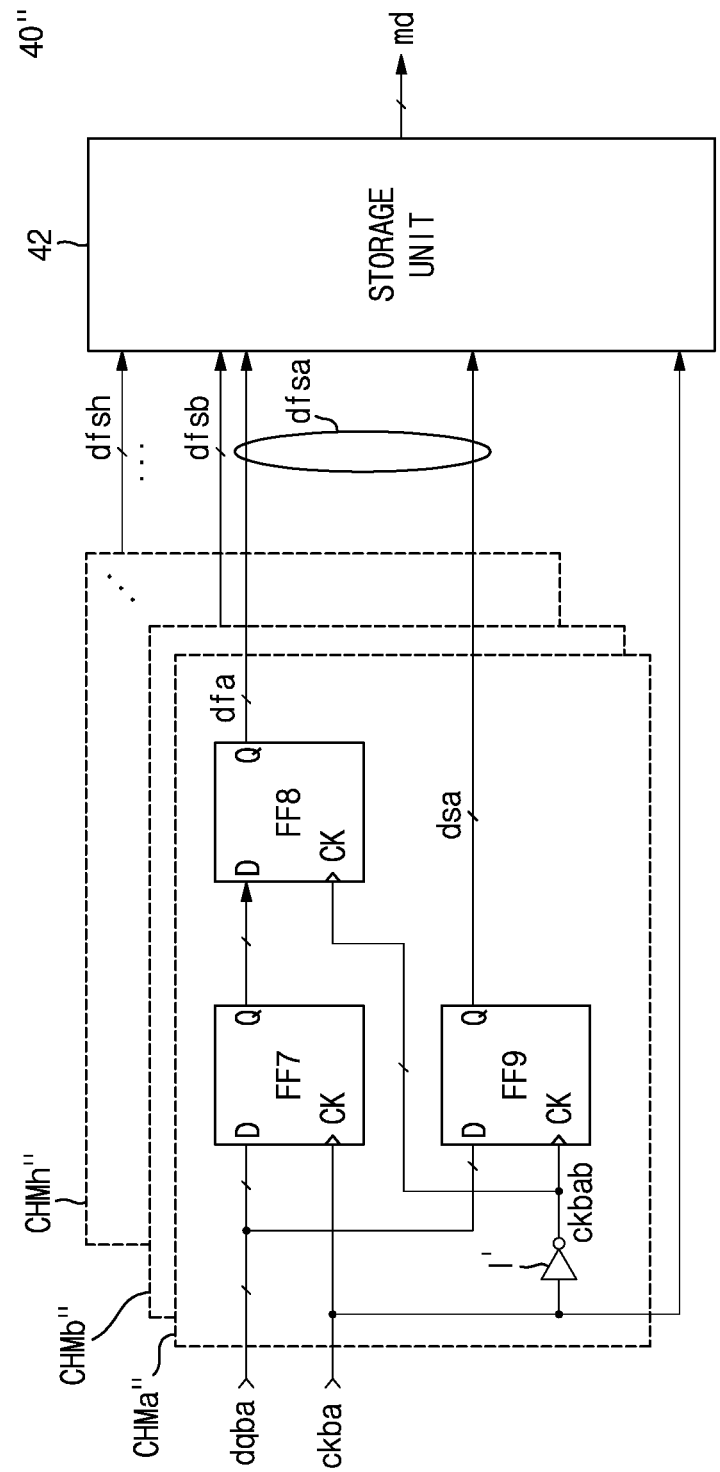
FIG. 13 is a diagram illustrating a configuration of a monitoring unit according to exemplary embodiments of the present disclosure.

Although the monitoring unit 40 or 40' shown in FIG. 6 or 10 described above may be configured to monitor all of the channel clock signals CKa to CKh and the channel command/addresses CAa to CAh applied for the eight memory channels MCHa to MCHh included in the plurality of memory dies MD1 to MD4, the present inventive concept may be configured to monitor all or a portion of the channel clock signal and the channel command/address of a specific channel. FIG. 13 is a diagram illustrating a configuration of the monitoring unit 40" according to exemplary embodiments of the present inventive concept. The monitoring unit 40" may include channel monitoring units CHMa" to CHMh" and a storage unit 42. Each of the channel monitoring units CHMa" to CHMh" may include an inverter I' and seventh to ninth flip flops FF7 to FF9.

Referring to FIG. 13, each of the seventh to ninth flip flops FF7 to FF9 may perform the same operation as the first to third flip flops FF1 to FF3 shown in FIG. 6. For example, the channel monitoring unit CHMa" may receive the buffered channel data dqba and generate odd data dfa and even data dsa. The channel monitoring unit CHMa" may generate the even and odd data dfa and dsa as the channel output data dfsa. The corresponding channel monitoring unit CHMb", CHMc", . . . , or CHMh" may receive the corresponding buffered channel data dqbb, dqbc, . . . , or dqbh, and generate the corresponding odd and even data dfb and dsb, dfc and dsc), . . . , or dfh and dsh as the corresponding channel output data dfsb, dfsc, . . . , or dfsh. The storage unit 42 may store the corresponding channel output data dfsa to dfsh in parallel in response to the corresponding buffered clock signal ckba to ckbh, and sequentially output the corresponding channel output data dfsa to dfsh as the monitoring data and in response to the corresponding buffered clock signal ckba to ckbh.

Figure 14:
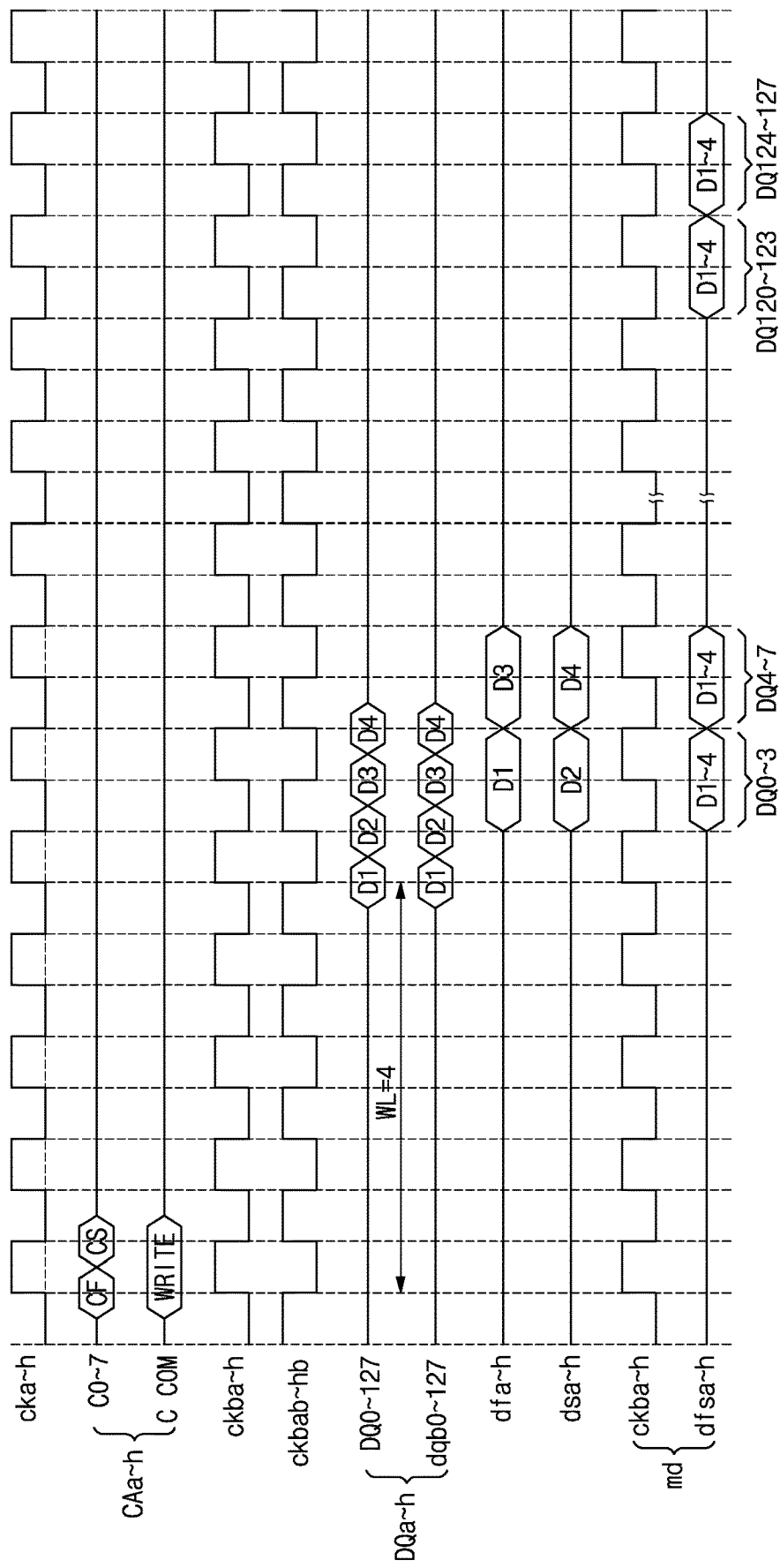
FIG. 14 is a timing diagram for describing an operation of a monitoring unit according to exemplary embodiments of the present disclosure.

FIG. 14 is a timing diagram for describing an operation of the monitoring unit 40" according to exemplary embodiments of the present inventive concept, when the HBM device 100 shown in FIGS. 1 and 2 has a write latency WL of 4 and a burst length BL of 4.

Referring to FIGS. 7B, 13, and 14, the write command WRITE and the column address may be applied according to the column command truth table. The odd column command/address CF and the even column command/address CS may be sequentially applied as the column command/address C0 to C7 in response to the rising edge and the falling edge of the corresponding channel clock signal CKa, CKb, . . . , or CKh during one clock cycle. The channel data DQa to DQh may be applied after four clock cycles corresponding to the write latency WL. Each channel data DQa to DQh may be 128-bit data DQ0 to DQ127. Four pieces of data D1 to D4 corresponding to the burst length BL may be sequentially input through one data terminal in response to the rising edge and the falling edge of the corresponding channel clock signal CKa, CKb, . . . , or CKh. FIG. 11 illustrates an assumption that each piece of the 128-bit data DQ0 to DQ127 is input through a corresponding one of 128 data terminals, and the same four pieces of data D1 to D4 are sequentially input through each data terminal.

The channel monitoring unit CHMa" may receive the buffered channel data (dqb0 to dqb127), and generate the data D1 and D3 as the odd data dfa and the data D2 and D4 as the even data dsa. The channel monitoring unit CHMa" may generate the odd data dfa and the even data dsa as the corresponding channel output data dfsa. Each of the channel monitoring units CHMb" to CHMh" may generate one of the corresponding channel output data dfsb to dfsh. The channel output data dfsa to dfsh may be stored in parallel in the storage unit 42. The storage unit 42 may output the channel output data dfsa for the memory channel MCHa stored in the storage unit 42 by four in response to the buffered channel clock signal ckba, that is, the storage unit 42 may be sequentially output a total of 16-bit parallel data. Although not shown, the corresponding channel output data dfsb, dfsc, . . . , or dfsh for the corresponding memory channel MCHb, MCHc, . . . , or MCHh stored in the storage unit 42 may be output by four in response to the corresponding buffered channel clock signal ckbb, ckbc, . . . , or ckbh, that is, the storage unit 42 may sequentially output a total of 16-bit parallel data. In this case, the storage unit 42 may be a parallel-to-serial converter.

As shown in FIG. 14, the monitoring unit 40" shown in FIG. 13 described above may receive the corresponding channel data DQa, DQb, . . . , or DQh (or the corresponding buffered channel data dqba, dqbb, . . . , or dqbh) applied in a DDR to be arranged at a center of the corresponding channel clock signal CKa, CKb, . . . , or CKh (or the corresponding buffered channel clock signal ckba, ckbb, . . . , or ckhb), and output the monitoring data and generated in the SDR to be arranged at an edge of the corresponding channel clock signal CKa, CKb, . . . , or CKh (or the corresponding buffered channel clock signal ckba, ckbb, . . . , or ckbh).

Further, the monitoring unit 40" shown in FIG. 13 described above may not include the seventh to ninth flip flops FF7 to FF9. When the monitoring unit 40" does not include the seventh to ninth flip flops FF7 to FF9, the monitoring unit 40" may generate the corresponding channel data DQa, DQb, . . . , or DQh (or the corresponding buffered channel data dqba, dqbb, . . . , or dqbh) shown in FIG. 13 as the monitoring data md through the storage unit 42. That is, the monitoring unit 40" may receive the corresponding channel data DQa, DQb, . . . , or DQh (or the corresponding buffered channel data dqba, dqbb, . . . , or dqbh) applied to be arranged at a center of the corresponding channel clock signal CKa, CKb, . . . , or CKh (or the corresponding buffered channel clock signal ckba, ckbb, . . . , or ckbh), and generate the monitoring data md output in the DDR.

Although the monitoring unit 40" shown in FIG. 13 described above may be configured to monitor all of the channel data DQa to DQh applied for the eight memory channels (MCHa to MCHh), the present inventive concept may be configured to monitor all or a portion of the channel data of a specific channel. Further, the monitoring unit 40" shown in FIG. 13 described above may not include the storage unit 42. In this case, the monitoring unit 40" may be configured to output only the channel data of the specific channel corresponding to at least the number of the first DA terminals dab used for monitoring.

Figure 15:
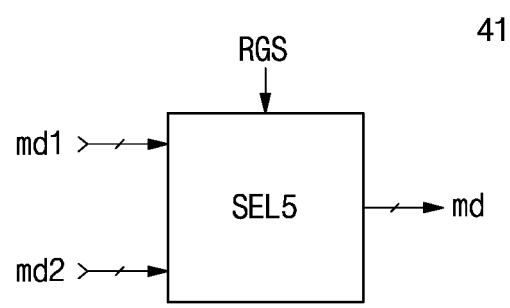
FIG. 15 is a diagram illustrating a configuration of a monitoring unit according to exemplary embodiments of the present disclosure.

FIG. 15 is a diagram illustrating a configuration of a monitoring unit according to exemplary embodiments of the present inventive concept. A monitoring unit 41 may have a configuration in which a fifth selector SEL5 is added in the monitoring units 40 and 40' shown in FIG. 6 or 10 and the monitoring unit 40" shown in FIG. 13. In FIG. 15, md1 represents the monitoring data output from the monitoring unit 40 or 40' shown in FIG. 6 or 10, and md2 represents the monitoring data output from the monitoring unit 40" shown in FIG. 13.

Referring to FIG. 15, the fifth selector SEL5 may output the monitoring data md1 or the monitoring data md2 as the monitoring data md in response to a fourth selection signal RGS.

The monitoring units 40, 40', 40", or 41 of the base die BD according to exemplary embodiments of the present inventive concept may output all or a portion of the channel clock signals CKa to CKh, the channel command/addresses CAa to CAh, and/or the channel data DQa to DQh, which are applied, as the monitoring data md in real time.

The first to fourth selection signals EOS, RCS, CHS, and RGS, and the DA enable signal DAEN described above may be set by storing the mode set code applied with the mode register set command MODE REGISTER SET shown in FIG. 7B applied through the first command/address bumps in the mode set register (not shown) included in the base die BD, in the system level test mode or the normal mode.

According to exemplary embodiments of the present inventive concept, the channel clock signal, the channel command/address, or the channel data applied from the controller to the HBM device of the system device may be monitored outside in real time, in the system level test mode or the normal mode. For example, the monitoring may include sending channel clock signals, channel command/addresses, and channel data received from a controller through a monitoring circuit of a base die BD of a memory device and to certain i/o terminals, such as direct access terminals, of the base die BD. The monitoring may include transmitting the information received at those i/o terminals, e.g., the monitored data, to a host, such as the host that originally sent instructions to the controller, to check whether the information being sent to the memory device accurately reflects the information originally sent to the controller from the host. The host may include, for example, one or more comparison circuits to compare the monitored data to original data sent to the controller from a host, for example.

While the embodiments of the present inventive concept have been described with reference to the accompanying drawings, it should be understood by those skilled in the art that various modifications may be made without departing from the scope of the present inventive concept and without changing essential features. Therefore, the above-described embodiments should be considered in a descriptive sense only and not for purposes of limitation.

We claim:

1. A memory device, comprising:
   a base die; and
   a plurality of memory dies stacked on the base die and electrically connected to the base die through a plurality of through substrate vias,
   wherein the base die includes:
   a plurality of first input buffers configured to receive channel clock signals, channel command/addresses, and channel data from a plurality of first bumps connected to the outside of the base die,
a plurality of second input buffers configured to receive test clock signals, test command/addresses, and test data from a plurality of second bumps connected to the outside of the base die,
a monitoring unit,
a plurality of first output buffers connected to the monitoring unit and configured to output monitored data from the monitoring unit to the plurality of second bumps, and
a plurality of paths from the plurality of first input buffers to the monitoring unit,
wherein the plurality of second bumps are connected to receive test clock signals, test command/addresses, and test data from the outside of the base die during a first operation mode, and to receive monitored data from the plurality of first output buffers during a second operation mode.

2. The memory device of claim 1, wherein:
the first operation mode is a direct access mode in which the test clock signals, test command/addresses, and test data are transmitted through the plurality of second bumps, which are direct access terminals, to the plurality of memory dies for testing of the plurality of memory dies, and
the second operation mode is a system level test mode or normal mode in which the channel clock signals, channel command/addresses, and channel data are transmitted through the plurality of first bumps and the plurality of first input buffers to the plurality of memory dies for accessing the memory dies, while the channel clock signals, channel command/addresses, and channel data are also transmitted through the monitoring unit and the plurality of first output buffers to be output from the base die at the plurality of second bumps.

3. The memory device of claim 1, wherein:
the monitored data includes the channel clock signals, channel command/addresses, and channel data received at the plurality of first input buffers.

4. The memory device of claim 3, wherein:
the channel clock signals, channel command/addresses, and channel data received at the plurality of first input buffers are transmitted to the plurality of memory dies during the second operation mode.

5. The memory device of claim 4, wherein:
the channel clock signals, channel command/addresses, and channel data received at the plurality of first input buffers are transmitted to the plurality of memory dies during the second operation mode while they are transmitted to the monitoring unit.

6. The memory device of claim 1, wherein:
the test clock signals, test command/addresses, and test data comprise test information, and all of the plurality of second bumps are used to receive the test information during the first operation mode and to receive the monitored data during the second operation mode.

7. The memory device of claim 1, wherein:
the first operation mode is a direct access test mode, and the second operation mode is a system level test mode or normal mode.

8. The memory device of claim 7, wherein:
the memory device is configured to output channel data, received from the plurality of memory dies, through a second output buffer during the second operation mode and to output test data, received from the plurality of memory dies, through the plurality of first output buffers during the first operation mode.

9. The memory device of claim 1, wherein the monitoring unit is configured to receive at least a portion of the channel command/addresses and the channel data applied in a double data rate (DDR), and to generate the monitored data in a single data rate (SDR) or DDR, in response to the channel clock signals.

10. The memory device of claim 9, wherein the monitoring unit is configured to receive the channel command/addresses, and generate at least a portion of row command/addresses and column command/addresses included in the channel command/addresses as the monitored data, in response to the channel clock signals.

11. The memory device of claim 10, wherein the monitoring unit includes a channel monitoring unit for each of the plurality of memory dies, and
the channel monitoring unit includes a row monitoring unit configured to receive the row command/addresses and generate at least a portion of an odd row command/address and an even row command/address included in the row command/address as a row output signal, in response to the channel clock signal, and a column monitoring unit configured to receive the column command/address and generate at least a portion of an odd column command/address and an even column command/address included in the column command/address as a column output signal, in response to the channel clock signal.

12. The memory device of claim 11, wherein the row monitoring unit includes a first flip-flop configured to receive and output the row command/address, in response to the channel clock signal, a second flip-flop configured to generate an output signal of the first flip-flop as the odd row command/address in response to an inverted channel clock signal generated by inverting the channel clock signal, and a third flip-flop configured to generate the row command and address as the even row command/address in response to the inverted channel clock signal, and
the column monitoring unit includes a fourth flip-flop configured to receive and output the column command/address, in response to the channel clock signal, a fifth flip-flop configured to generate an output signal of the fourth flip-flop as the odd column command/address, in response to the inverted channel clock signal, and a sixth flip-flop configured to generate the column command/address as the even column command and address, in response to the inverted channel clock signal, and
wherein the odd row command/address includes a first odd row command/address and a second odd row command/address which are sequentially generated, and the even row command/address includes a first even row command/address and a second even row command/address which are sequentially generated.

13. The memory device of claim 12, wherein the row monitoring unit further includes a first selector configured to generate the odd row command/address or the even row command/address as the row output signal, in response to a first selection signal, and
the column monitoring unit further includes a second selector configured to generate the odd column command/address or the even column command/address as the column output signal, in response to the first selection signal.

14. The memory device of claim 13, wherein the channel monitoring unit further includes a third selector configured to generate the row output signal or the column output signal as a channel output signal, in response to a second selection signal, and the monitoring unit further includes a fourth selector configured to select and output one of the channel output signals output from the channel monitoring units, in response to a third selection signal.

15. The memory device of claim 11, wherein the row monitoring unit includes:

a first flip-flop configured to generate the row command/address as the odd row command/address, in response to the channel clock signal, and a second flip-flop configured to generate the row command/address as the even row command/address, in response to an inverted channel clock signal generated by inverting the channel clock signal, and wherein the column monitoring unit includes:

a third flip-flop configured to generate the column command/address as the odd column command/address, in response to the channel clock signal, and a fourth flip-flop configured to generate the column command/address as the even column command/address, in response to the inverted channel clock signal.

16. The memory device of claim 15, wherein the row monitoring unit further includes a first selector configured to generate the odd row command/address as the row output signal in response to the channel clock signal or generate the even row command/address as the row output signal in response to the channel clock signal, and the column monitoring unit further includes a second selector configured to generate the odd column command/address as the column output signal in response to the channel clock signal or the even column command/address as the column output signal, in response to the channel clock signal in response to the channel clock signal, and wherein the odd row command and address includes a first odd row command/address and a second odd row command/address which are sequentially generated, the even row command/address includes a first even row command/address and a second even row command/address which are sequentially generated, the row output signal includes the first odd row command/address, the first even row command/address, the second odd row command/address, and the second even row command/address which are sequentially generated, and the column output signal includes the odd column command/address and the even column command/address which are sequentially generated.

17. The memory device of claim 16, wherein the channel monitoring unit further includes a third selector configured to generate the row output signal or the column output signal as a channel output signal, in response to a second selection signal, and the monitoring unit further includes a fourth selector configured to select and output one of the channel output signals output from the channel monitoring units, in response to a third selection signal.

18. The memory device of claim 9, wherein the monitoring unit includes a channel monitoring unit for each of the plurality of memory dies, and the channel monitoring unit includes a first flip-flop configured to receive and output the channel data in response to the channel clock signal, a second flip-flop configured to generate an output signal of the first flip-flop as odd data, in response to an inverted channel clock signal generated by inverting the channel clock signal, a third flip-flop configured to generate the channel data as even data, in response to the inverted channel clock signal, and a storage unit configured to store the odd data and the even data in parallel in response to the channel clock signal, and sequentially generate the odd data and the even data as monitoring data.

* * * * *